(12) United States Patent
Nagao

(10) Patent No.: US 11,164,645 B2
(45) Date of Patent: *Nov. 2, 2021

(54) SEMICONDUCTOR MEMORY DEVICE

(71) Applicant: Kioxia Corporation, Tokyo (JP)

(72) Inventor: Osamu Nagao, Fujisawa Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/197,090

(22) Filed: Mar. 10, 2021

(65) Prior Publication Data
US 2021/0193240 A1    Jun. 24, 2021

Related U.S. Application Data

(63) Continuation of application No. 16/775,151, filed on Jan. 28, 2020, now Pat. No. 10,978,166.

(30) Foreign Application Priority Data

Sep. 9, 2019  (JP) .............................. JP2019-163931

(51) Int. Cl.
| | | |
|---|---|---|
| *G11C 16/04* | (2006.01) | |
| *G11C 16/34* | (2006.01) | |
| *G11C 11/56* | (2006.01) | |
| *G11C 16/26* | (2006.01) | |
| *G11C 16/10* | (2006.01) | |
| *G11C 16/08* | (2006.01) | |

(52) U.S. Cl.
CPC ...... *G11C 16/3459* (2013.01); *G11C 11/5671* (2013.01); *G11C 16/0483* (2013.01); *G11C 16/08* (2013.01); *G11C 16/10* (2013.01); *G11C 16/26* (2013.01)

(58) Field of Classification Search
CPC ............ G11C 16/3459; G11C 11/5671; G11C 16/0483; G11C 16/08; G11C 16/10; G11C 16/26
See application file for complete search history.

(56) References Cited

U.S. PATENT DOCUMENTS

| | | | |
|---|---|---|---|
| 8,593,877 B2 * | 11/2013 | Joo ..................... | G11C 16/0483 365/185.22 |
| 8,891,311 B2 * | 11/2014 | Joo ..................... | G11C 11/5628 365/185.19 |
| 9,147,501 B2 | 9/2015 | Hung et al. | |
| 9,892,794 B2 | 2/2018 | Micheloni et al. | |

(Continued)

OTHER PUBLICATIONS

U.S. Appl. No. 17/017,738, Osamu Nagao; Title: "Semiconductor Memory Device"; filed Sep. 11, 2020.

*Primary Examiner* — Pho M Luu
(74) *Attorney, Agent, or Firm* — Holtz, Holtz & Volek PC

(57) ABSTRACT

A semiconductor memory device includes memory cells, a word line, and a controller. The controller is configured to: execute a first program operation in which a first program voltage is applied to the word line; execute a second program operation in which the first program voltage is applied to the word line, when a resumed first verify operation ends; and execute a third program operation in which a second program voltage higher than the first program voltage is applied to the word line, after a resumed second verify operation.

20 Claims, 17 Drawing Sheets

(56) References Cited

U.S. PATENT DOCUMENTS

| | | |
|---|---|---|
| 10,249,377 B2 | 4/2019 | Kasai et al. |
| 10,795,607 B2 * | 10/2020 | Lee ........................ G06F 3/0659 |
| 10,978,166 B1 * | 4/2021 | Nagao ................ G11C 16/3459 |
| 2018/0247695 A1 | 8/2018 | Kasai et al. |

* cited by examiner

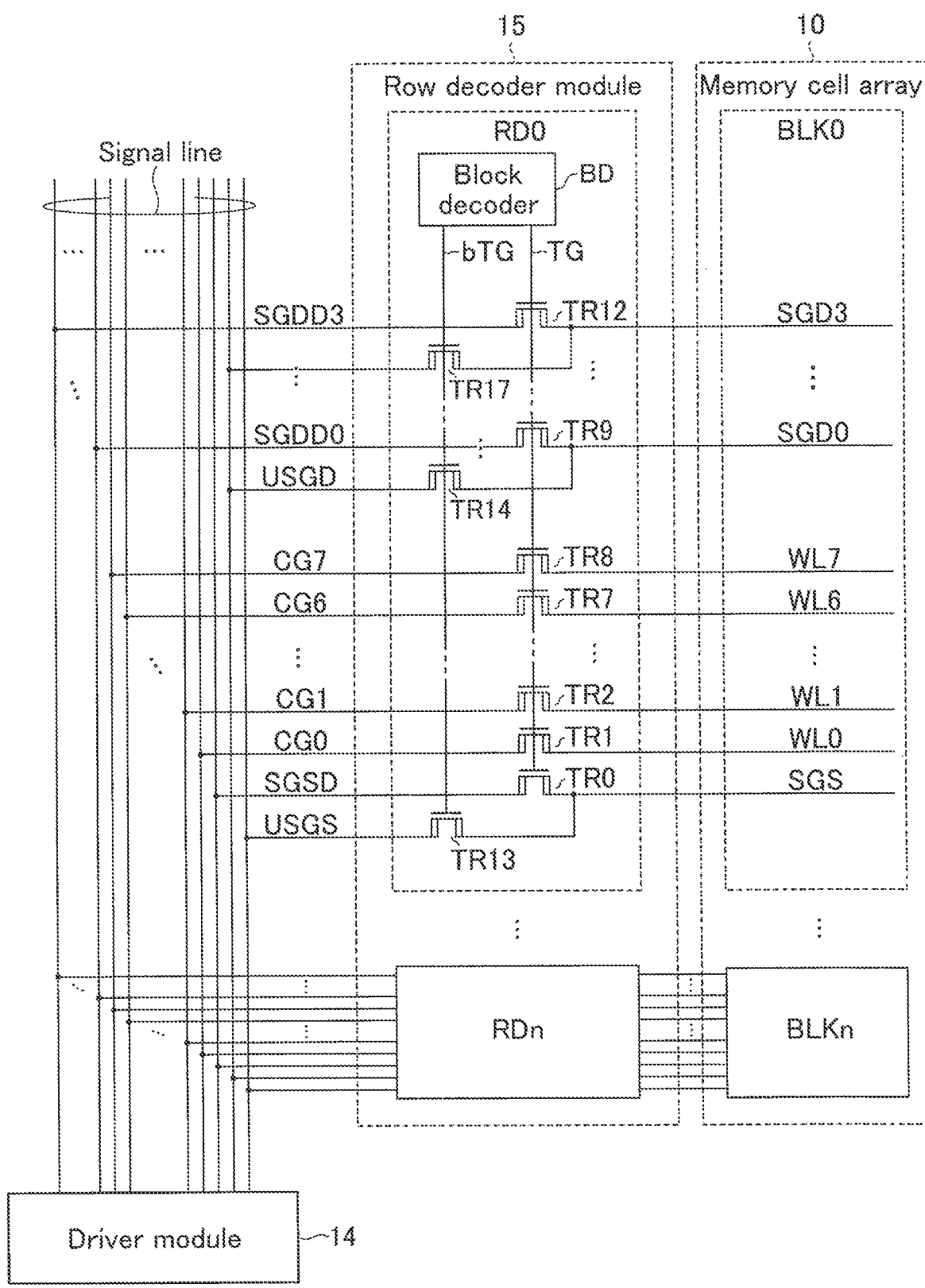
F I G. 3

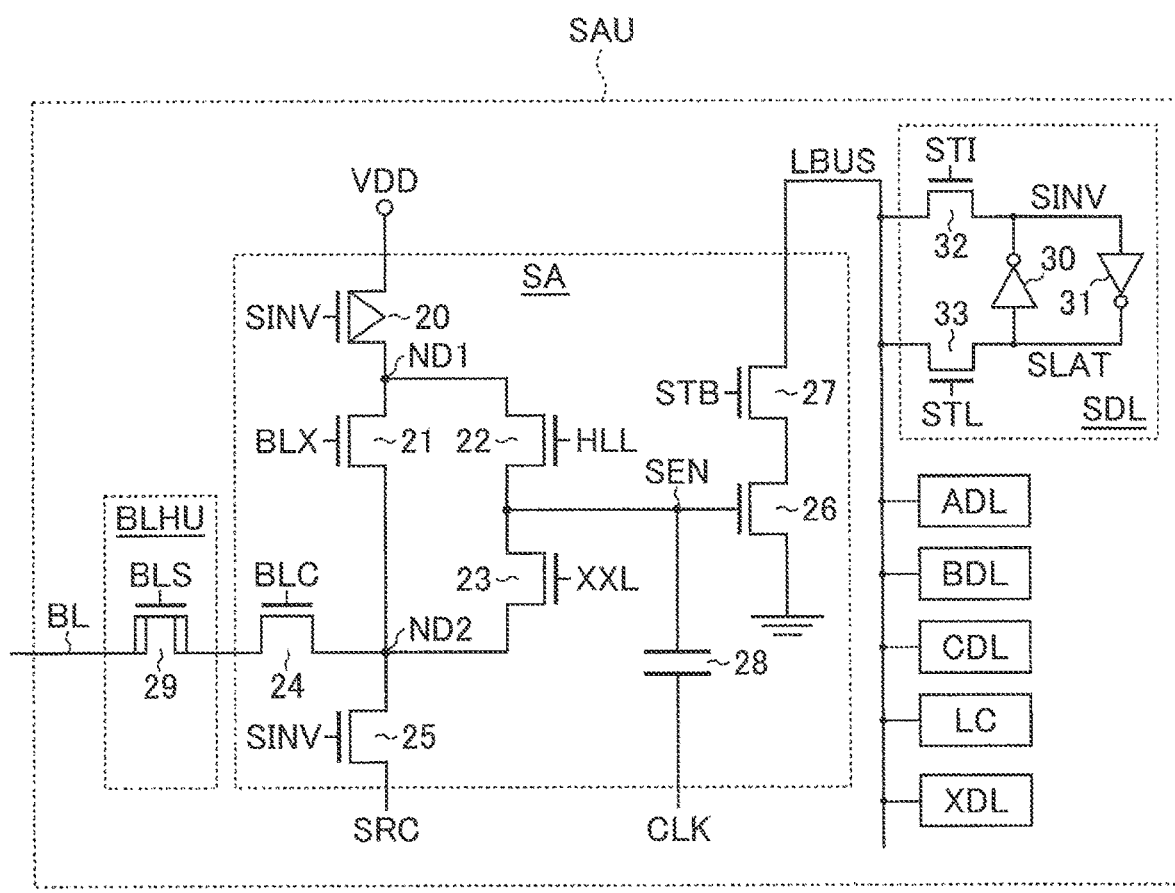
F I G. 5

Influence of STDR in write operation in "A" state
(1) When "A" state verify is executed after program operation
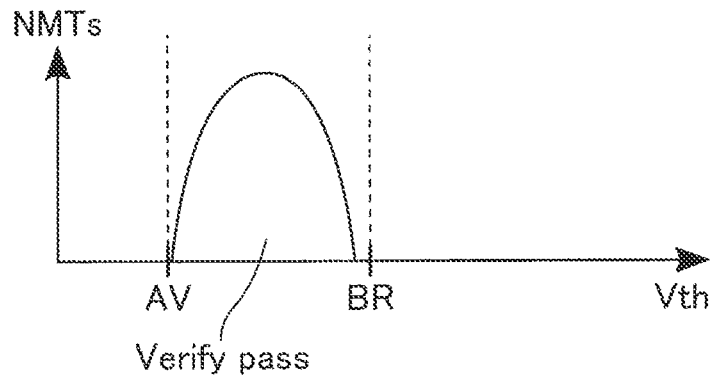
(2) When verify is executed again after suspend read
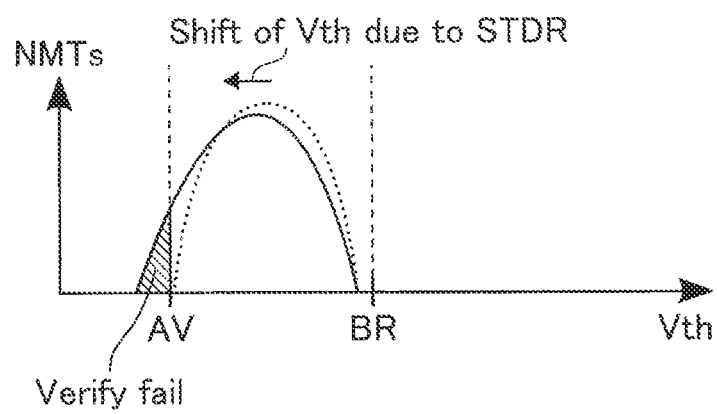
(3) When program operation using stepped up VPGM is executed
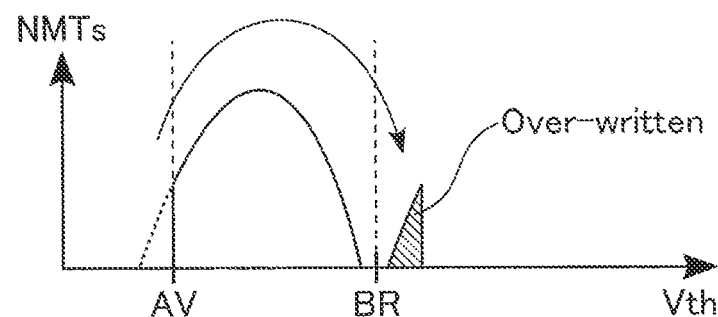
F I G. 11

Comparative example of third embodiment

| Suspend timing | Verify execution state | | |
|---|---|---|---|
| | After resume | After rewrite | Total |
| Immediately after application of VPGM | A/B/C/D | A/B/C/D | 8 |
| After execution of one-state verify | B/C/D | A/B/C/D | 7 |
| After execution of two-state verifies | C/D | A/B/C/D | 6 |
| After execution of three-state verifies | D | A/B/C/D | 5 |

Third embodiment

| Suspend timing | Verify execution state | | |
|---|---|---|---|
| | After resume | After rewrite | Total |
| Immediately after application of VPGM | A/B/C/D | A/B/C/D | 8 |
| After execution of one-state verify | B/C/D | B/C/D | 6 |
| After execution of two-state verifies | C/D | C/D | 4 |
| After execution of three-state verifies | D | D | 2 |

F I G. 20

SEMICONDUCTOR MEMORY DEVICE

CROSS-REFERENCE TO RELATED APPLICATIONS

This application is a Continuation Application of U.S. application Ser. No. 16/775,151 (now U.S. Pat. No. 10,978,166), filed on Jan. 28, 2020, which is based upon and claims the benefit of priority from Japanese Patent Application No. 2019-163931, filed Sep. 9, 2019, the entire contents of all of which are incorporated herein by reference.

FIELD

Embodiments described herein relate generally to a semiconductor memory device.

BACKGROUND

There is known a NAND-type flash memory that is capable of storing data in a nonvolatile manner.

BRIEF DESCRIPTION OF THE DRAWINGS

FIG. 3 is a circuit diagram illustrating an example of a circuit configuration of a row decoder module included in the semiconductor memory according to the first embodiment;

FIG. 5 is a circuit diagram illustrating an example of a circuit configuration of a sense amplifier unit included in the sense amplifier module of the semiconductor memory device according to the first embodiment;

FIG. 11 is a threshold distribution diagram illustrating an example of how the threshold distribution of a memory cell transistor changes when short term data retention occurs in the write operation in the "A" state;

FIG. 20 is a table illustrating an example of how many times a verify operation is performed when suspend read is executed in the write operation of the semiconductor memory device according to the third embodiment.

DETAILED DESCRIPTION

Figure 1:
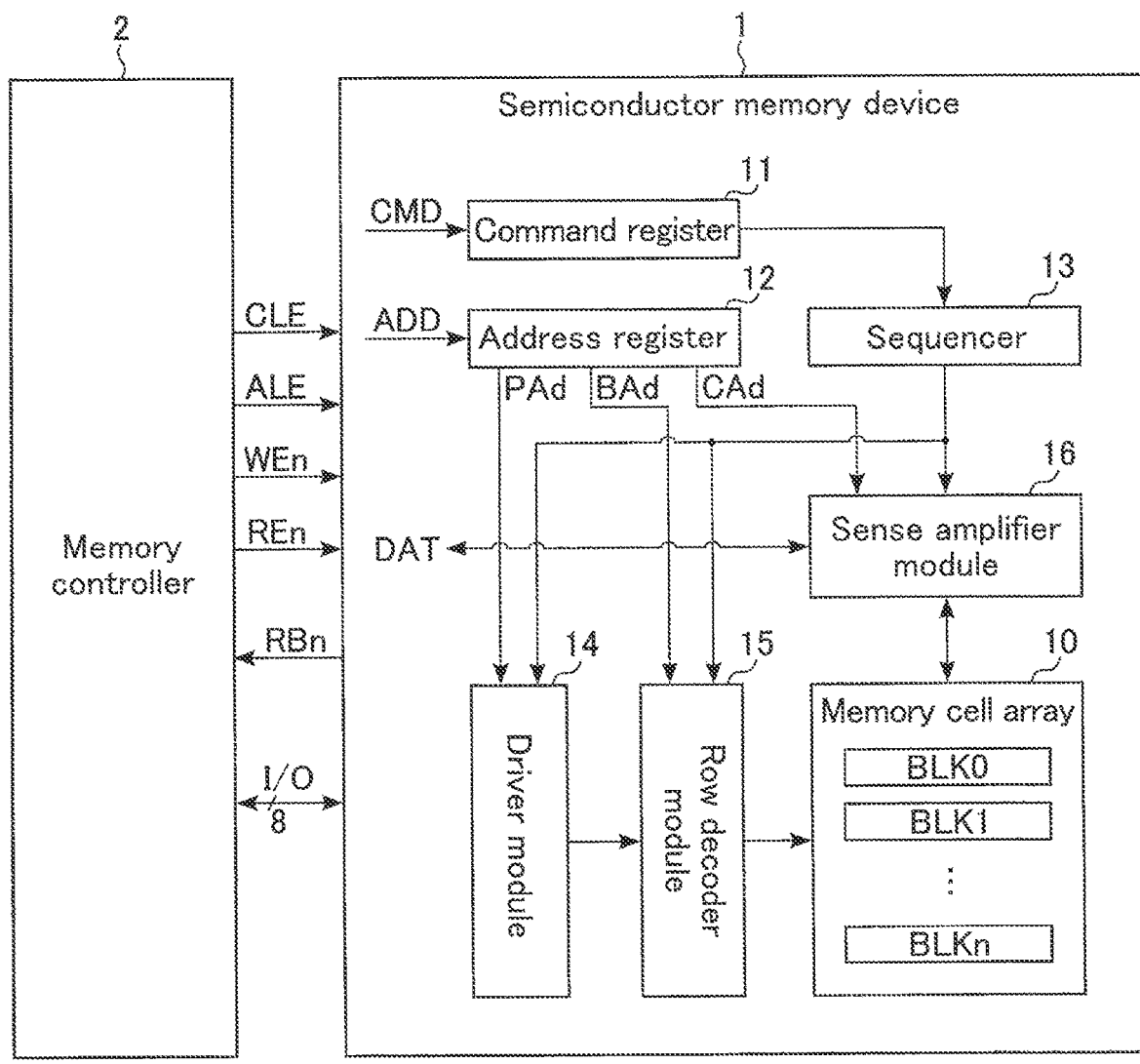
FIG. 1 is a block diagram illustrating a configuration example of a semiconductor memory device according to a first embodiment.

In general, according to one embodiment, a semiconductor memory device includes a plurality of memory cells, a word line, and a controller. Each of the memory cells is capable of storing a plurality of bits of data. The word line is coupled to the memory cells. The controller is configured to execute a write operation. In the write operation, the controller is configured to repeatedly execute a program loop including a program operation and a verify operation. In a repetition of the program loop, the controller is configured to: execute a first program operation in which the a first program voltage is applied to the word line; stop a first verify operation associated with the first program operation and started after the first program operation, upon reception of a first suspend command; resume the first verify operation upon reception of a first resume command; execute a second program operation in which the first program voltage is applied to the word line, when the resumed first verify operation ends; stop a second verify operation associated with the second program operation and started after the second program operation, upon reception of a second suspend command; resume the second verify operation upon reception of a second resume command; and execute a third program operation in which a second program voltage higher than the first program voltage is applied to the word line, when the resumed second verify operation ends.

Hereinafter, embodiments will be described with reference to the accompanying drawings. Each embodiment exemplifies a device and a method for embodying the technical idea of the invention. The drawings are schematic or conceptual, and the dimensions, rations, etc. in the drawings are not necessarily the same as actual products. The technical concept underlying the present invention is not limited by the shapes, structures, arrangements, etc. of the structural elements.

In the description below, elements having the same functions and configurations will be denoted by the same reference symbols. The numbers after the letters of reference symbols are referred to by the reference signs containing the same letters and are used to distinguish between elements having similar configurations. Where elements denoted by reference symbols including the same letters need not be discriminated from each other, they will be denoted by reference symbols including only letters.

[1] First Embodiment

A semiconductor memory device 1 according to the first embodiment will be described.

[1-1] Configuration of Semiconductor Memory Device 1

[1-1-1] Overall Configuration of Semiconductor Memory Device 1

FIG. 1 is a block diagram illustrating a configuration example of a semiconductor memory device 1 according to the first embodiment. The semiconductor memory device 1 is a NAND-type flash memory capable of storing data in a nonvolatile manner, and is controlled by an external memory controller 2. As illustrated in FIG. 1, the semiconductor memory device 1 includes, for example, a memory cell array 10, a command register 11, an address register 12, a sequencer 13, a driver module 14, a row decoder module 15, and a sense amplifier module 16.

The memory cell array 10 includes a plurality of blocks BLK0 to BLKn (n is an integer of 1 or more). The block BLK includes an aggregation of a plurality of memory cells capable of storing data in a nonvolatile manner, and is used, for example, as a data erase unit. The memory cell array 10 is provided with a plurality of bit lines and a plurality of word lines. For example, each memory cell is associated with one bit line and one word line. A detailed configuration the memory cell array 10 will be described later.

The command register 11 holds a command CMD which the semiconductor memory device 1 receives from the memory controller 2. The command CMD includes, for example, an instruction to cause the sequencer 13 to execute a read operation, a write operation, an erase operation, etc.

The address register 12 holds address information ADD which the semiconductor memory device 1 receives from the memory controller 2. The address information ADD includes, for example, a block address BAd, a page address PAd, and a column address CAd. For example, the block address BAd, the page address PAd, and the column address CAd are used to select a block BLK, a word line and a bit line, respectively.

The sequencer 13 controls the overall operation of the semiconductor memory device 1. For example, the sequencer 13 controls the driver module 14, row decoder module 15, sense amplifier module 16, etc., based on the command CMD held in the command register 11, to execute a read operation, a write operation, an erase operation, etc.

The driver module 14 generates voltages used in the read operation, write operation, erase operation, etc. Also, the driver module 14 applies the generated voltages to a signal line corresponding to a selected word line, based on, for example, the page address PAd held in the address register 12.

The row decoder module 15 selects one of blocks BLK in the corresponding memory cell array 10, based on the block address BAd held in the address register 12. Also, the row decoder module 15 transfers, for example, the voltage applied to the signal line corresponding to the selected word line to the selected word line in the selected block BLK.

The sense amplifier module 16 applies a desired voltage to each bit line in accordance with write data DAT that is received from the memory controller 2 in the write operation. Further, in the read operation, the sense amplifier module 16 determines what data is stored in the memory cell, based on the voltage of the bit line, and transfers a determination result to the memory controller 2 as read data DAT.

Communications between the semiconductor memory device 1 and the memory controller 2 support, for example, the NAND interface standard. For example, in the communications between the semiconductor memory device 1 and the memory controller 2, a command latch enable signal CLE, an address latch enable signal ALE, a write enable signal WEn, a read enable signal REn, a ready/busy signal RBn, and an input/output signal I/O are used.

The command latch enable signal CLE is a signal indicating that the input/output signal I/O received by the semiconductor memory device 1 is a command CMD. The address latch enable signal ALE is a signal indicating that the input/output signal I/O received by the semiconductor memory device 1 is address information ADD. The write enable signal WEn is a signal that instructs the semiconductor memory device 1 to input the input/output signal I/O. The read enable signal REn is a signal that instructs the semiconductor memory device 1 to output the input/output signal I/O. The ready/busy signal RBn is a signal that notifies the memory controller 2 whether the semiconductor memory device 1 is in a ready state or in a busy state. The ready state is a state where the semiconductor memory device 1 accepts an instruction, and the busy state is a state where the semiconductor memory device 1 does not accept an instruction. The input/output signal I/O is, for example, an 8-bit signal and can include a command CMD, address information ADD, data DAT, etc.

The semiconductor memory device 1 and memory controller 2 described above may constitute one semiconductor device by combining them together. Examples of such a semiconductor device include a memory card such as an SD™ card, and a solid state drive (SSD).

[1-1-2] Circuit Configuration of Semiconductor Memory Device 1

(Circuit Configuration of Memory Cell Array 10)

Figure 2:
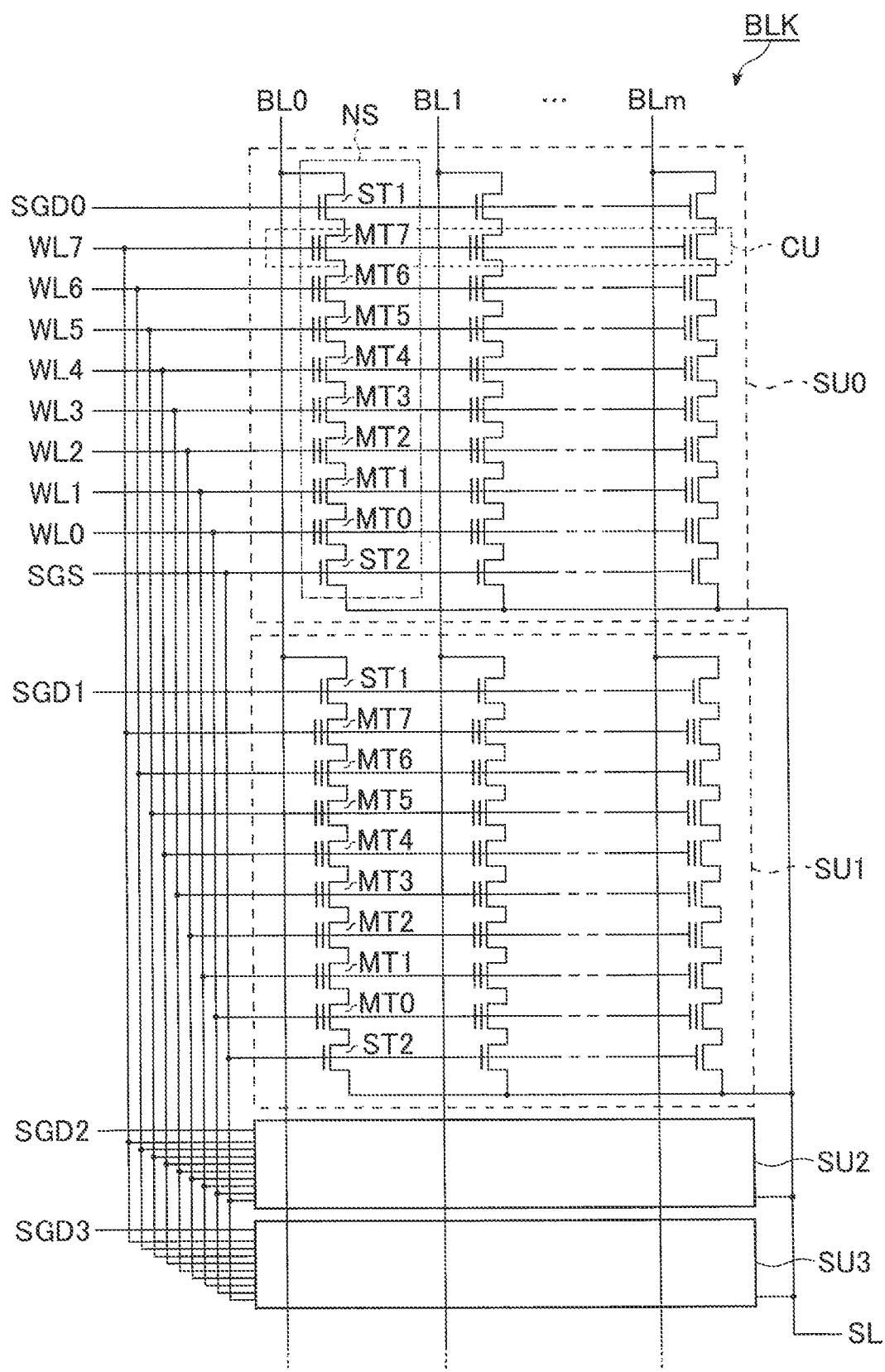
FIG. 2 is a circuit diagram illustrating an example of a circuit configuration of a memory cell array included in the semiconductor memory device according to the first embodiment.

FIG. 2 shows an example of a circuit configuration of the memory cell array 10 included in the semiconductor memory device 1 according to the first embodiment, focusing on one block BLK extracted out of the plurality of blocks BLK included in the memory cell array 10. As illustrated in FIG. 2, the block BLK includes, for example, four string units SU0 to SU3.

Each string unit SU includes a plurality of NAND strings NS respectively associated with bit lines BL0 to BLm (m is an integer of 1 or more). Each NAND string NS includes, for example, memory cell transistors MT0 to MT7, and select transistors ST1 and ST2. Each of the memory cell transistors MT includes a control gate and a charge storage layer, and holds data in a nonvolatile manner. Select transistors ST1 and ST2 are used for selecting string unit SU during various operations.

In each NAND string NS, memory cell transistors MT0 to MT7 are coupled in series. The drain of select transistor ST1 is coupled to an associated bit line BL, and the source of select transistor ST1 is coupled to one end of serially coupled memory cell transistors MT0 to MT7. The drain of select transistor ST2 is coupled to the other end of the serially coupled memory cell transistors MT0 to MT7. The source of select transistor ST2 is coupled to source line SL.

In the same block BLK, the control gates of memory cell transistors MT0 to MT7 are commonly coupled to word lines WL0 to WL7, respectively. The gates of select transistors ST1 in string units SU0 to SU3 are commonly coupled to select gate lines SGD0 to SGD3, respectively. The gates of select transistors ST2 included in the same block BLK are commonly coupled to select gate line SGS.

In the circuit configuration of the memory cell array 10 described above, the bit line BL is shared by the NAND strings NS to which the same column address is assigned in each string unit SU. The source line SL is shared, for example, by a plurality of blocks BLK.

A set of a plurality of memory cell transistors MT coupled to a common word line WL in one string unit SU are referred to, for example, as a cell unit CU. For example, the storage capacity of the cell unit CU including memory cell transistors MT each storing 1-bit data is defined as "1 page data". The cell unit CU may have a storage capacity of two page data or more in accordance with the number of bits of data stored in the memory cell transistor MT.

The circuit configuration of the memory cell array 10 included in the semiconductor memory device 1 of the first embodiment is not limited to the configuration described above. For example, the number of string units SU included in each block BLK, the number of memory cell transistors MT included in each NAND string NS and the number of select transistors ST1 and ST2 included in each NAND string NS can be designed to may be any number.

(Circuit Configuration of Row Decoder Module 15)

FIG. 3 illustrates an example of a circuit configuration of the row decoder module 15 included in the semiconductor memory device 1 according to the first embodiment. As illustrated in FIG. 3, the row decoder module 15 includes, for example, row decoders RD0 to RDn and is coupled to the driver module 14 via signal lines CG0 to CG7, SGDD0 to SGDD3, SGSD, USGD and USGS.

Hereinafter, a detailed circuit configuration of the row decoder RD will be described by focusing on row decoder RD0 corresponding to block BLK0. The row decoder RD includes, for example, a block decoder BD, transfer gate lines TG and bTG, and transistors TR0 to TR17.

The block decoder BD decodes block address BAd. The block decoder BD applies predetermined voltages to transfer gate lines TG and bTG based on the decoding result. The voltage applied to transfer gate line TG and the voltage applied to transfer gate line bTG have a complementary relationship. In other words, the inverted signal of a signal of transfer gate line TG is input to transfer gate line bTG.

Each of transistors TR0 to TR17 is a high breakdown voltage N-type MOS transistor. The gates of transistors TR0 to TR12 are commonly coupled to transfer gate line TG. The gates of transistors TR13 to TR17 are commonly coupled to transfer gate line bTG. Each transistor TR is coupled between the signal lines extending from the driver module 14 and the interconnects provided in the corresponding block BLK.

Specifically, the drain of transistor TR0 is coupled to signal line SGSD. The source of transistor TR0 is coupled to select gate line SGS. The drains of transistors TR1 to TR8 are coupled to signal lines CG0 to CG7, respectively. The sources of transistors TR1 to TR8 are coupled to word lines WL0 to WL7, respectively. The drains of transistors TR9 to TR12 are coupled to signal lines SGDD0 to SGDD3, respectively. The drains of transistors TR9 to TR12 are coupled to select gate lines SGD0 to SGD3, respectively. The drain of transistor TR13 is coupled to signal line USGS. The source of transistor TR13 is coupled to select gate line SGS. The drains of transistors TR14 to TR17 are commonly coupled to signal line USGD. The sources of transistors TR14 to TR17 are coupled to select gate lines SGD0 to SGD3, respectively.

That is, signal lines CG0 to CG7 are used as a global word line shared by a plurality of blocks BLK, and word lines WL0 to WL7 are used as local word lines provided for the respective blocks. Signal lines SGDD0 to SGDD3 and SGSD are used as a global gate line shared by the plurality of blocks BLK, and select gate lines SGD0 to SGD3 and SGS are used as local transfer gate lines provided for the respective blocks.

With the above configuration, the row decoder module 15 can select block BLK. Specifically, in various operations, the block decoder BD corresponding to selected block BLK applies "H" level and "L" level voltages to transfer gate lines TG and bTG, respectively, and the block decoder BD corresponding to non-selected block BLK applies "L" level and "H" level voltages to transfer gate lines TG and bTG, respectively.

The circuit configuration of the row decoder module 15 described above is merely an example, and can be modified as appropriate. For example, the number of transistors TR included in the row decoder module 15 is designed based on the number of interconnects provided in each block BLK.

(Circuit Configuration of Sense Amplifier Module 16)

Figure 4:
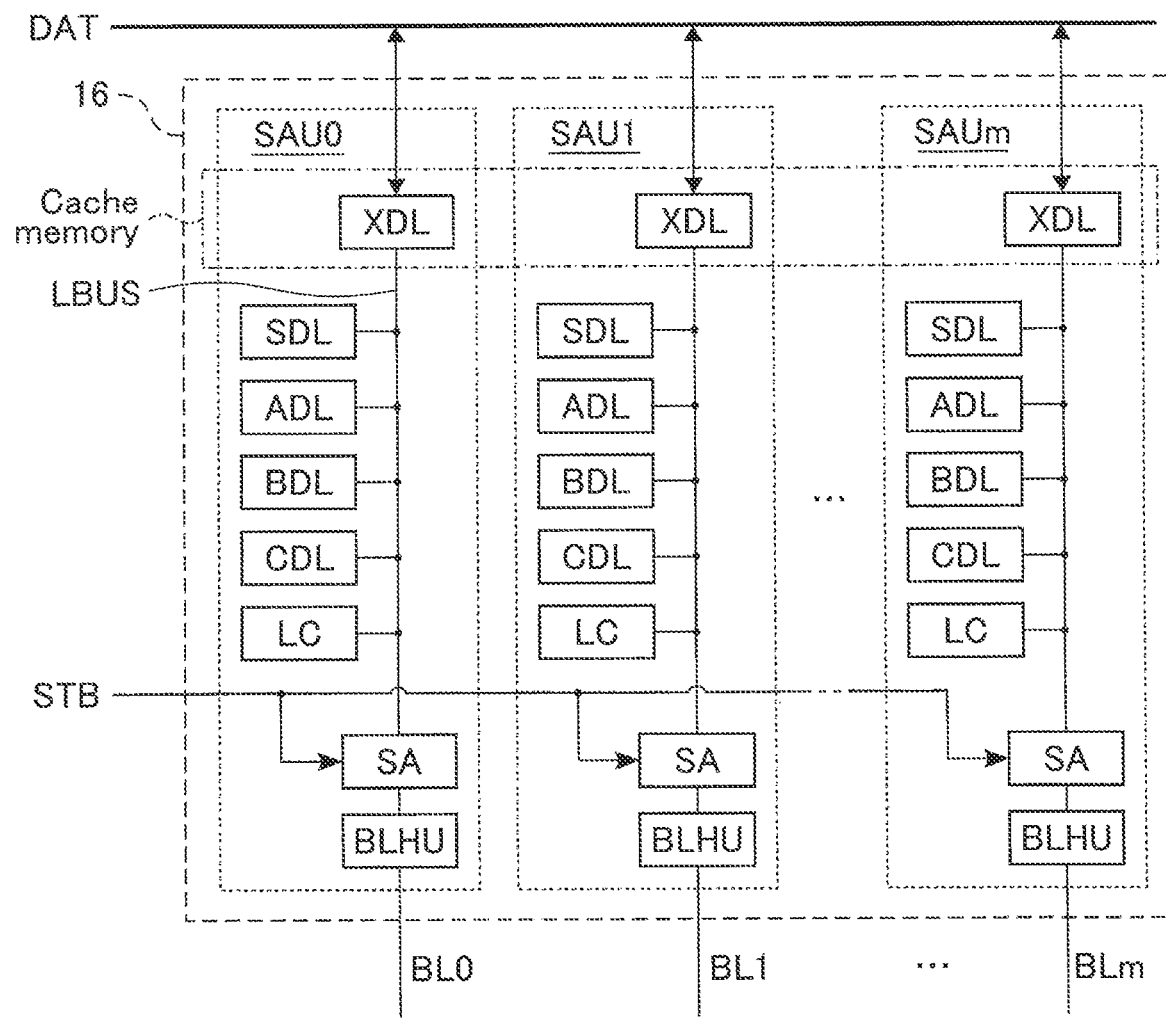
FIG. 4 is a circuit diagram illustrating an example of a circuit configuration of a sense amplifier module included in the semiconductor memory device according to the first embodiment.

FIG. 4 illustrates an example of a circuit configuration of the sense amplifier module 16 included in the semiconductor memory device according to the first embodiment. As illustrated in FIG. 4, each sense amplifier unit SAU includes, for example, a bit line coupling unit BLHU, a sense amplifier SA, a logic circuit LC, and latch circuits SDL, ADL, BDL, CDL and XDL.

Bit line coupling unit BLHU includes a high-breakdown-voltage transistor coupled between the associated bit line BL and the sense amplifier SA. The sense amplifier SA, the logic circuit LC, and the latch circuits SDL, ADL, BDL, CDL and XDL are commonly coupled to a bus LBUS. The latch circuits SDL, ADL, BDL, CDL and XDL can transmit/receive data to/from each other.

For example, control signal STB generated by the sequencer 13 is input to each sense amplifier SA. Each sense amplifier unit SA determines whether the data read to the associated bit line BL is "0" or "1", based on the timing at which control signal STB is asserted. That is, the sense amplifier SA determines data stored in the selected memory cell based on the voltage of the bit line BL.

The logic circuit LC performs various logic operations, using data that are held in the latch circuits SDL, ADL, BDL, CDL and XDL coupled to the common bus LBUS. Specifically, the logic circuit LC can execute an AND operation, an OR operation, a NAND operation, a NOR operation, an EXNOR operation, or the like, using data held in two latch circuits.

Each of latch circuits SDL, ADL, BDL, CDL and XDL temporarily holds data. Latch circuit XDL is used for the input/output of data DAT between the input/output circuit of the semiconductor memory device 1 and the sense amplifier unit SAU. Latch circuit XDL can also be used as, for example, a cache memory of the semiconductor memory device 1. The semiconductor memory device 1 can be in the ready state, at least when latch circuit XDL is vacant.

FIG. 5 illustrates an example of a circuit configuration of the sense amplifier unit SAU included in the semiconductor memory device 1 according to the first embodiment. As illustrated in FIG. 5, for example, the sense amplifier SA includes transistors 20 to 27 and a capacitor 28, and the bit line coupling unit BLHU includes transistor 29. Transistor 20 is a P-type MOS transistor. Each of transistors 21 to 27 is an N-type MOS transistor. Transistor 29 is an N-type MOS transistor having a higher breakdown voltage than transistors 20 to 27.

The source of transistor 20 is coupled to a power supply line. The drain of transistor 20 is coupled to node ND1. The gate of transistor 20 is coupled to, for example, node SINV in latch circuit SDL. The drain of transistor 21 is coupled to node ND1. The source of transistor 21 is coupled to node ND2. Control signal BLX is input to the gate of transistor 21. The drain of transistor 22 is coupled to node ND1. The source of transistor 22 is coupled to node SEN. Control signal HLL is input to the gate of transistor 22.

The drain of transistor 23 is coupled to node SEN. The source of transistor 23 is coupled to node ND2. Control signal XXL is input to the gate of transistor 23. The drain of transistor 24 is coupled to node ND2. Control signal BLC is input to the gate of transistor 24. The drain of transistor 25 is coupled to node ND2. The source of transistor 25 is coupled to node SRC. The gate of transistor 25 is coupled to, for example, node SINV in latch circuit SDL.

The source of transistor 26 is grounded. The gate of transistor 26 is coupled to node SEN. The drain of transistor 27 is coupled to the bus LBUS. The source of transistor 27 is coupled to the drain of transistor 26. Control signal STB is input to the gate of transistor 27. One electrode of capacitor 28 is coupled to node SEN. Clock CLK is input to the other electrode of capacitor 28.

The drain of transistor 29 is coupled to the source of transistor 24. The source of transistor 29 is coupled to bit line BL. Control signal BLS is input to the gate of transistor 29.

Latch circuit SDL includes, for example, inverters 30 and 31 and N-type MOS transistors 32 and 33. The input node of inverter 30 is coupled to node SLAT, and the output node of inverter 30 is coupled to node SINV. The input node of inverter 31 is coupled to node SINV, and the output node of inverter 31 is coupled to node SLAT. One end of transistor 32 is coupled to node SINV, the other end of transistor 32 is coupled to the bus LBUS, and control signal STI is input to the gate of transistor 32. One end of transistor 33 is coupled to node SLAT, the other end of transistor 33 is coupled to the bus LBUS, and control signal STL is input to the gate of transistor 33. For example, the data held at node SLAT corresponds to the data held in latch circuit SDL, and the data held at node SINV corresponds to inverted data of the data held at node LAT.

The circuit configurations of latch circuits ADL, BDL, CDL and XDL are similar to the circuit configuration of, for example, latch circuit SDL. For example, latch circuit ADL holds data at node ALAT and holds its inverted data at node AINV. For example, control signal ATI is input to the gate of transistor 32 of latch circuit ADL, and control signal ATL is input to the gate of transistor 33 of latch circuit ADL. A description of latch circuits BDL, CDL and XDL is omitted.

In the circuit configuration of the sense amplifier unit SAU described above, for example, power supply voltage VDD is applied to the power supply line coupled to the source of transistor 20. For example, power supply voltage VSS is applied to node SRC. Each of control signals BLX, HLL, XXL, BLC, STB and BLS and clock CLK are generated, for example, by the sequencer 13.

It should be noted that the sense amplifier module 16 included in the semiconductor memory device 1 according to the first embodiment is not limited to the circuit configuration described above. For example, the number of latch circuits included in each sense amplifier unit SAU can be changed as appropriate, based on the number of pages stored in one cell unit CU. The logic circuit LC in sense amplifier unit SAU may be omitted if the logic operations can be executed only by the latch circuits in sense amplifier unit SAU.

[1-1-3] Data Storage Method

Figure 6:
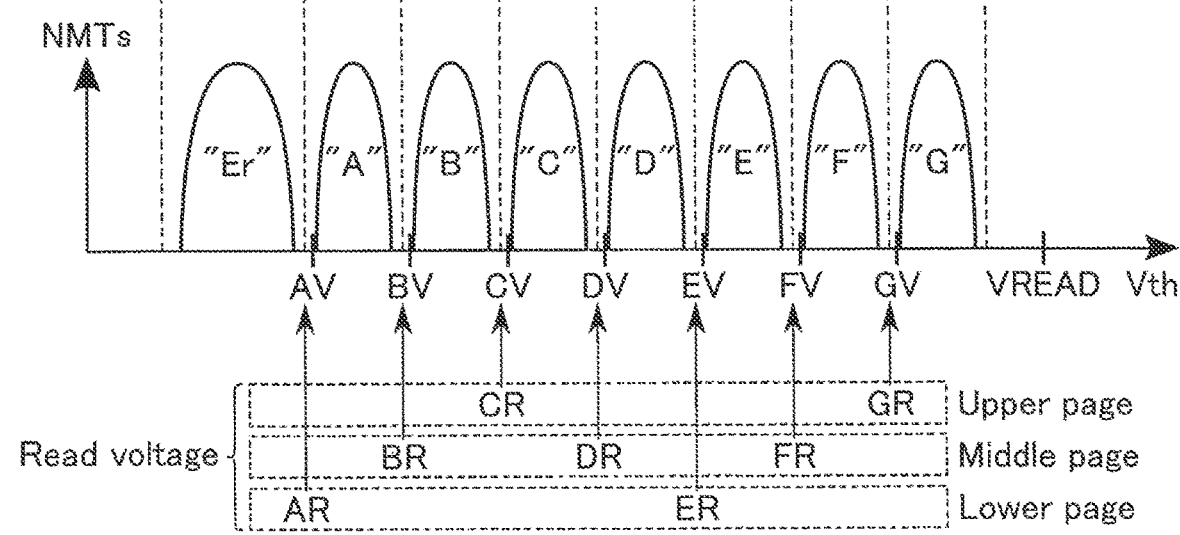
FIG. 6 is a diagram illustrating an example of data allocation that is applied to a memory cell transistor in the semiconductor memory device according to the first embodiment.

FIG. 6 illustrates an example of how the threshold distributions, read voltages and verify voltages of memory cell transistors MT are in the semiconductor memory device 1 according to the first embodiment. In the threshold distribution diagram referred to below, NMTs on the vertical axis represents the number of memory cell transistors MT, and Vth on the horizontal axis represents threshold voltages of the memory cell transistors MT.

As illustrated in FIG. 6, in the semiconductor memory device 1 according to the first embodiment, for example, eight types of threshold distributions are formed by a plurality of memory cell transistors MT. These eight types of threshold distributions are referred to, for example, as "Er" state, "A" state, "B" state, "C" state, "D" state, "E" state, "F" state and "G" state in the ascending order of threshold voltage. The "Er" state corresponds to the erased state of memory cell transistor MT. Each of the "A" state to "G" state corresponds to a state in which data is written in memory cell transistor MT.

Different 3-bit data are allocated to the "Er" state to "G" state, and are set such that only 1-bit data changes between two adjacent states. The method of storing 3-bit data in one memory cell transistor is called a TLC (Triple-Level Cell) method. An example of data allocation to the eight types of threshold distribution are as follows:

"Er" state: "111 (upper bit/middle bit/lower bit)" data
"A" state: "110" data
"B" state: "100" data
"C" state: "000" data
"D" state: "010" data
"E" state: "011" data
"F" state: "001" data
"G" state: "101" data.

A verify voltage used in a write operation is set between the adjacent states. Specifically, verify voltage AV is set between the "Er" state and the "A" state, verify voltage BV is set between the "A" state and the "B" state, verify voltage CV is set between the "B" state and the "C" state, verify voltage DV is set between the "C" state and the "D" state, verify voltage EV is set between the "D" state and the "E" state, verify voltage FV is set between the "E" state and the "F" state, and verify voltage GV is set between the "F" state and the "G" state. In a write operation, the semiconductor memory device 1 detects that the threshold voltage of memory cell transistor MT for storing certain data exceeds the verify voltage corresponding to the data, and, upon detection, completes the program for the memory cell transistor MT.

A read voltage used in a read operation is set between the adjacent states. Specifically, read voltage AR is set between the "Er" state and the "A" state, read voltage BR is set between the "A" state and the "B" state, read voltage CR is set between the "B" state and the "C" state, read voltage DR is set between the "C" state and the "D" state, read voltage ER is set between the "D" state and the "E" state, read voltage FR is set between the "E" state and the "F" state, and read voltage GR is set between the "F" state and the "G" state. Read pass voltage VREAD is set to a voltage higher than the "G" state.

Read voltages AR, BR, CR, DR, ER, FR and GR are respectively used for distinction between the "Er" state and the "A" state or higher, distinction between the "A" state or lower and the "B" state or higher, distinction between "B" state or lower and "C" state or higher, distinction between "C" state or lower and "D" state or higher, distinction between the "D" state or lower and the "E" state or higher, distinction between the "E" state or lower and the "F" state or higher, and distinction between the "F" state or lower and the "G" or higher.

The memory cell transistor MT whose gate is applied with read pass voltage VREAD is turned on without reference to the data it stores. In the read operation, the semiconductor memory device 1 determines read data by determining a state in which the memory cell transistors MT are distributed using the read voltage.

For example, where the data allocation illustrated in FIG. 6 is applied, one page data consisting of lower bits (lower page data) is determined by read operations respectively using read voltages AR and ER. One page data consisting of middle bits (middle page data) is determined by read operations respectively using read voltages BR, DR and FR. One page data consisting of upper bits (upper page data) is determined by read operations respectively using read voltages CR and GR. In a page read operation using a plurality of read voltages, the logic circuit LC appropriately performs arithmetic processing.

It should be noted that the aforementioned number of bits of data stored in one memory cell transistor MT is an example and is not limited to this. For example, data of 1 bit, data of 2 bits, or data of 4 bits or more may be stored in the memory cell transistor MT. In the semiconductor memory device 1, the number of threshold distributions formed, the read voltages, the read pass voltage, the verify voltages, etc. can be appropriately set in accordance with the number of bits stored in the memory cell transistor MT.

[1-2] Operation of Semiconductor Memory Device 1

Next, a description will be given of an operation performed by the semiconductor memory device according to the first embodiment. In the description below, a selected word line WL will be referred to as WLsel, and a non-selected word line WL will be referred to as WLusel. The application of a voltage to word line WL corresponds to the operation in which the driver module 14 applies the voltage to the related interconnect via signal line CG and row decoder module 15. Command CMD and address information ADD received by the semiconductor memory device 1 are transferred to the command register 11 and the address register 12, respectively. Write data received by the semiconductor memory device 1 is transferred to a plurality of latch circuits XDL of a plurality of sense amplifier units SAU included in the sense amplifier module 16.

[1-2-1] Outline of Write Operation

Figure 7:
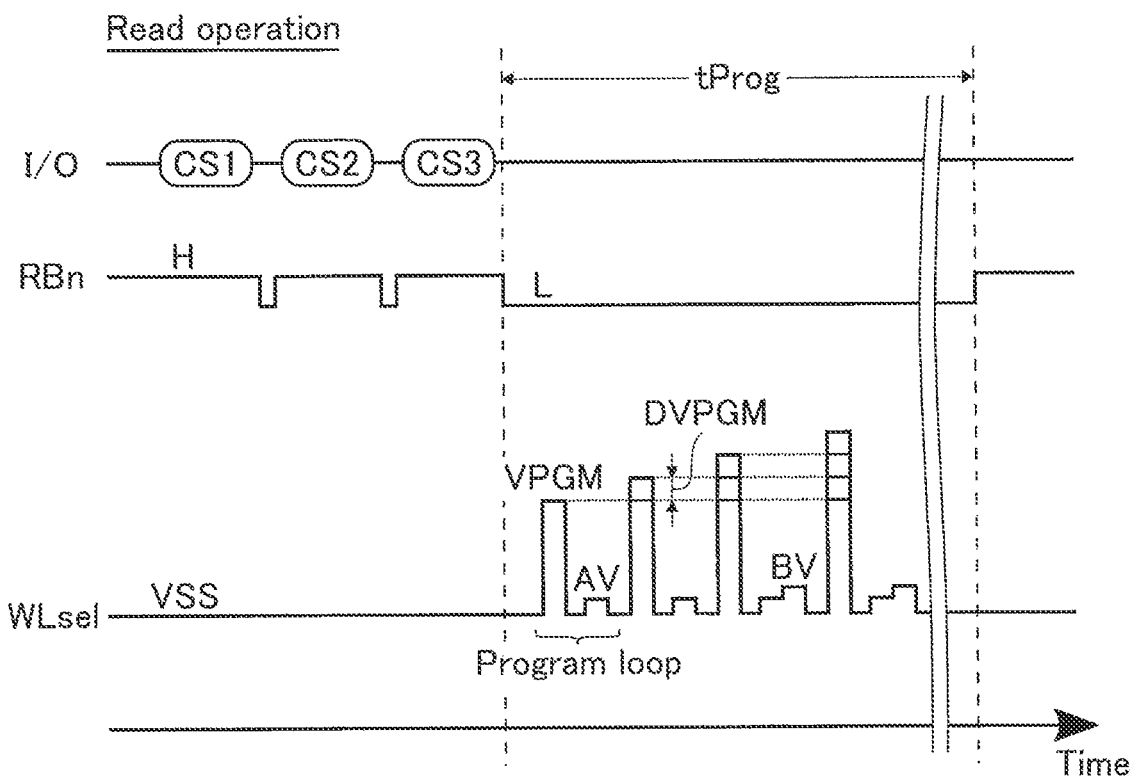
FIG. 7 is a timing chart illustrating an example of how a write operation is performed in the semiconductor memory device according to the first embodiment.

First, a description will be given of an outline of a write operation performed by the semiconductor memory device 1 according to the first embodiment. FIG. 7 illustrates an example of a command sequence and a timing chart of the write operation performed by the semiconductor memory device 1 according to the first embodiment, and indicates a voltage applied to word line WLsel. As illustrated in FIG. 7, in the state before the write operation, ready/busy signal RBn is at the "H" level, and the voltage of word line WLsel is VSS.

First, the memory controller 2 transmits command sets CS1, CS2 and CS3 to the semiconductor memory device 1 in the order mentioned. Each of command sets CS1 to CS3 includes, for example, a command for instructing a write operation and address information, and command sets CS1 to CS3 include write data for a lower page, a middle page and an upper page, respectively.

Upon reception of command set CS1, the semiconductor memory device 1 temporarily transitions from the ready state to the busy state. Then, the sequencer 13 transfers the write data of the lower page held in each latch circuit XDL to, for example, latch circuit ADL that shares the bus LBUS in the sense amplifier unit SAU.

Upon reception of command set CS2, the semiconductor memory device 1 temporarily transitions from the ready state to the busy state. Then, the sequencer 13 transfers the write data of the middle page held in each latch circuit XDL to, for example, latch circuit BDL that shares the bus LBUS in the sense amplifier unit SAU.

Upon reception of command set CS3, the semiconductor memory device 1 temporarily transitions from the ready state to the busy state. Then, the sequencer 13 starts a write operation based on the command CMD held in the command register 11, the address information held in the address register 12, and the write data held in the sense amplifier module 16. In the write operation, the sequencer 13 repeatedly executes a program loop. The program loop includes, for example, a program operation and a verify operation.

The program operation is an operation for increasing the threshold voltage of the memory cell transistor MT. In the program operation, the memory cell transistor MT of selected cell unit CU is set based on write data held in the sense amplifier unit SAU such that the memory cell transistor MT is in the program target state or is the program inhibit state. Specifically, the memory cell transistor MT that has not reached the threshold voltage of the state corresponding to the write data held in the sense amplifier unit SAU (hereinafter referred to as a write state) is set as a program target state, and the memory cell transistor MT that has reached the threshold voltage is set as a program inhibit transistor.

In the program operation, program voltage VPGM is applied to word line WLsel. Program voltage VPGM is a voltage that is high enough to increase the threshold voltage of the memory cell transistor MT. When program voltage VPGM is applied to word line WLsel, the threshold voltage of the memory cell transistor MT that is coupled to word line WLsel and coupled to the program target bit line BL increases. On the other hand, an increase in the threshold voltage of the memory cell transistor MT that is coupled to word line WLsel and coupled to the program-inhibited bit line BL is suppressed by, for example, a self-boost technique. When the program operation ends, the sequencer 13 proceeds to the verify operation.

The verify operation is a read operation for determining whether or not the memory cell transistor MT of a selected cell unit CU has reached the threshold voltage of the write state. In the verify operation, a verify voltage used for determination of the threshold voltage is determined for each sense amplifier unit SAU. Hereinafter, the state in which verify is executed will be referred to as a verify state. For example, in the verify read of the first program loop, a read operation using verify voltage AV is executed. The verify state can be appropriately changed according to the progress of the program loop.

The memory cell transistor MT that is confirmed to have reached the threshold voltage of the write state by the verify read is determined to have passed the verify. Each sense amplifier unit SAU holds the verify result of the write state in one of the internal latch circuits. Then, the sequencer 13 refers to the determination result of each sense amplifier unit SAU, counts the number of memory cell transistors MT for which write has been completed for each write state, and determines whether or not the write for the state has been completed.

The set of program operation and verify operation described above corresponds to one program loop. Program voltage VPGM is stepped up every time the program loop is repeated. That is, program voltage VPGM applied to word line WLsel increases in accordance with the number of times the program loop is executed. The step-up amount DVPGM of program voltage VPGM can be set to any value.

If, in the repetition of the program loop, the sequencer 13 detects that the number of memory cell transistors MT that have not passed the verify in the "A" state to "G" state falls below a predetermined number, the sequencer 13 ends the write operation and transitions the semiconductor memory device from the busy state to the ready state. When the write operation ends, 3-page data is written to the selected cell unit CU. The "tProg" shown in FIG. 7 indicates the time during which the write operation is executed.

[1-2-2] Suspend Read

Figure 8:
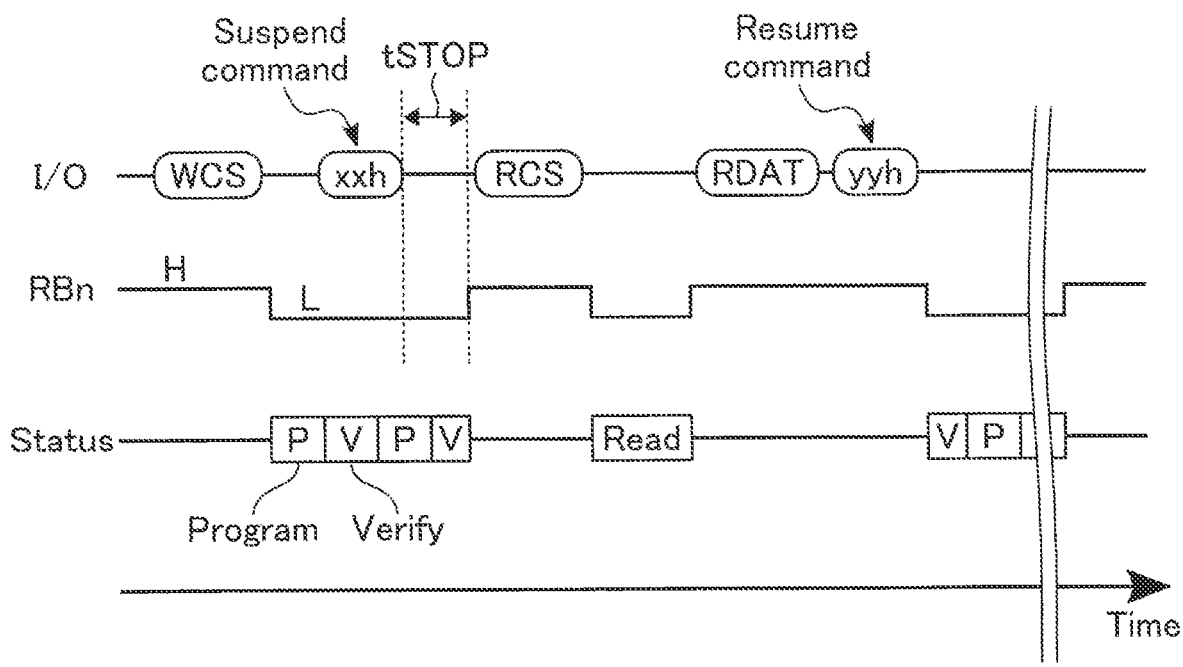
FIG. 8 is a timing chart illustrating an example of how suspend read is executed in the semiconductor memory device according to the first embodiment.

The semiconductor memory device 1 according to the first embodiment can execute read, with a write operation suspended. In this specification, a read operation that is executed with a write operation suspended will be referred to as suspend read. FIG. 8 shows an example of a timing chart illustrating how the suspend read is executed in the semiconductor memory device according to the first embodiment. The "Status" in FIG. 8 indicates an operation that is executed by the semiconductor memory device 1.

As illustrated in FIG. 8, first, the memory controller 2 transmits write command set WCS to the semiconductor memory device 1. Write command set WCS includes, for example, commands similar to command sets CS1 to CS3, address information, write data, etc. In this example, a busy state in which data transfer between the latch circuits is executed is not illustrated.

Upon reception of write command set WCS, the semiconductor memory device 1 temporarily transitions from the ready state to the busy state. Then, the sequencer 13 starts a write operation, based on command CMD held in the command register 11, the address information held in the address register 12, and the write data held in the sense amplifier module 16. "P" and "V" of "Status" illustrated in FIG. 8 respectively indicate that a program operation and a verify operation are executed.

Then, the memory controller 2 transmits a suspend command xxh to the semiconductor memory device 1 when the semiconductor memory device 1 is in the busy state owing to the execution of the write operation. Upon reception of the suspend command xxh, the semiconductor memory device 1 executes a suspend process, for example, by suspending the write operation when the verify operation is being executed. The "tSTOP" in FIG. 8 corresponds to the time from the reception of the suspend command xxh to the transition of the semiconductor memory device 1 from the busy state to the ready state. It should be noted that while the write operation is being suspended, the sense amplifier module 16 of the semiconductor memory device 1 continues to hold the result of the verify operation performed before the suspend.

When the memory controller 2 detects that the semiconductor memory device 1 has transitioned from the busy state to the ready state after transmitting the suspend command, the memory controller 2 transmits read command set RCS to the semiconductor memory device 1. Read command set RCS includes, for example, a command for instructing a read operation, and address information. Upon reception of read command set RCS, the semiconductor memory device 1 transitions from the ready state to the busy state and starts a read operation (suspend read). At the end of the suspend read, the semiconductor memory device 1 transitions from the busy state to the ready state and transmits read data RDAT to the memory controller 2.

When read data RDAT is received by the suspend read, the memory controller 2 instructs the semiconductor memory device 1 to resume the write operation. Specifically, the memory controller 2 transmits a resume command yyh to the semiconductor memory device 1. The semiconductor memory device 1 transitions from the ready state to the busy state based on the reception of the resume command yyh, and resumes the suspended write operation. In the resumed write operation, the sequencer 13 executes, for example, the process subsequent to the suspended verify operation.

When read data RDAT is received by the suspend read, the memory controller 2 may instruct the semiconductor memory device 1 to issue read command set RCS in place of the resumption of the write operation. In addition, the memory controller 2 may transmit the resume command yyh to the semiconductor memory device 1 after repeating these operations a plurality of times.

[1-2-3] Write Operation where Suspend Read is Executed

In the first embodiment, the sequencer 13 controls whether or not rewrite is performed in accordance with the number of times suspend read is executed in the program loop. "Rewrite" indicates a program operation that is executed again using the same program voltage as used in the interrupted program loop when suspend read is inserted in the middle of the program loop. In this specification, "one program loop" is defined as including a program operation using the same program voltage and a verify operation associated with the program operation. That is, "one program loop" can include a plurality of program operations and a plurality of verify operations when rewrite is executed.

Figure 9:
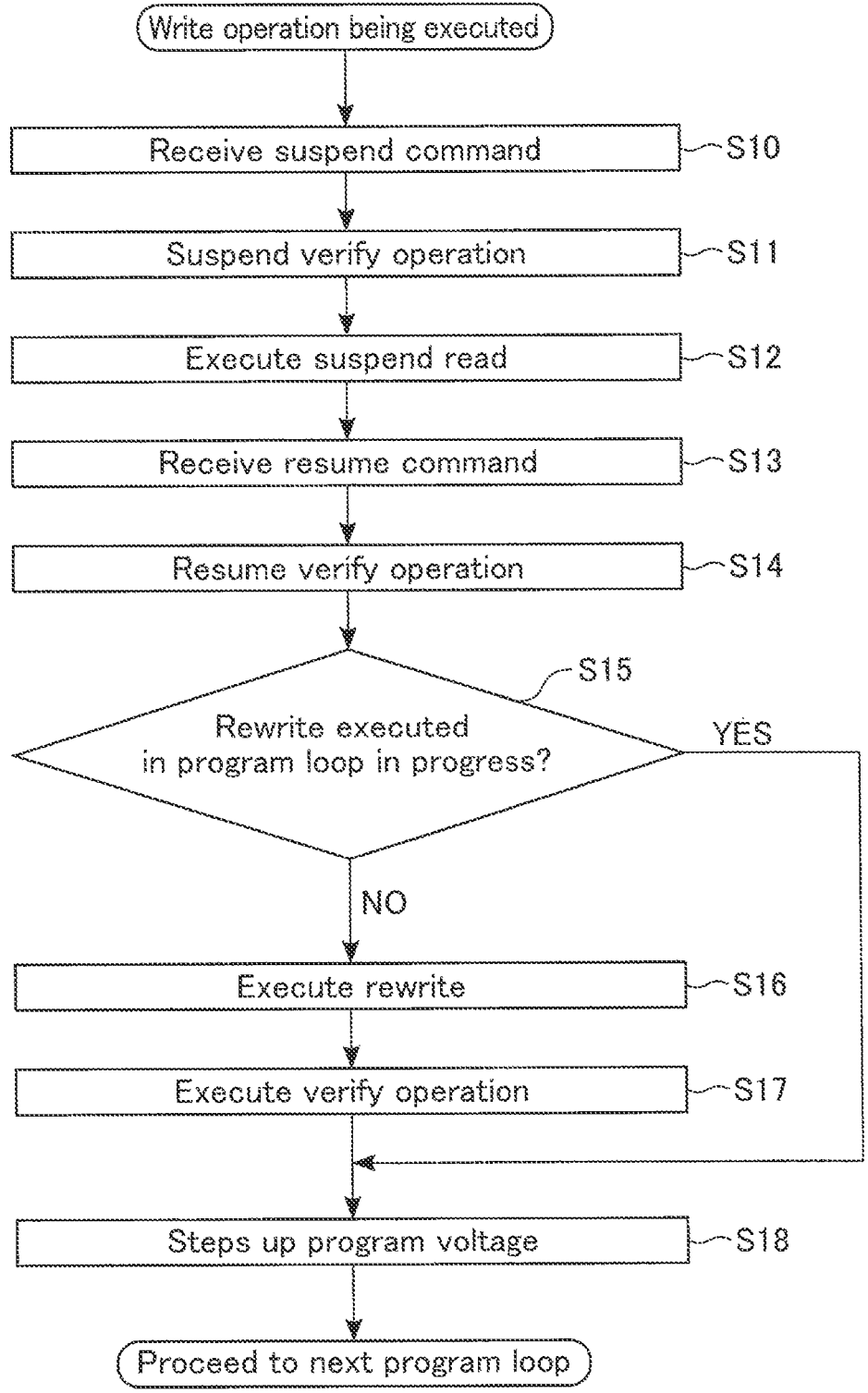
FIG. 9 is a flowchart illustrating an example of an operation that is performed when suspend read is executed in the write operation of the semiconductor memory device according to the first embodiment.

In the following, a description will be given of an operation that is performed from the time when the suspend read is executed in the middle of a write operation to the time when the process proceeds to the next loop after the write operation is resumed. FIG. 9 shows an example of a flowchart illustrating how the suspend read in the write operation is executed in the semiconductor memory device 1 according to the first embodiment.

As illustrated in FIG. 9, the semiconductor memory device 1 receives a suspend command from the memory controller 2 during execution of a write operation (step S10). The sequencer 13 suspends a verify operation based on the suspend command (step S11). Then, the semiconductor memory device 1 executes suspend read based on the instruction from the memory controller 2 (step S12). After the semiconductor memory device 1 transmits the read data acquired by the suspend read to the memory controller 2, the semiconductor memory device 1 receives a resume command from the memory controller 2 (step S13). Then, the sequencer 13 resumes the verify operation based on the resume command (step S14). When the resumed verify operation ends, the sequencer 13 confirms whether or not rewrite is executed in the program loop in progress (step S15).

Where rewrite is not executed in the program loop in progress (step S15, NO), the sequencer 13 executes rewrite (step S16). Specifically, the sequencer 13 executes a program operation using the same program voltage as used in the interrupted program loop. Then, the sequencer 13 executes a verify operation associated with the rewrite (step S17). The verify state in this verify operation is set, for example, in the same manner as the verify state associated with the program loop.

Where rewrite is executed in the program loop in progress (step S15, YES), or where the process of step S17 is executed, the sequencer 13 steps up the program voltage (step S18). The sequencer 13 proceeds to the next program loop process using the stepped-up program voltage. If a suspend command is received during the verify operation of step S17, the sequencer 13 returns to the process of step S11. That is, the sequencer 13 can execute suspend read a plurality of times in the same program loop.

Figure 10:
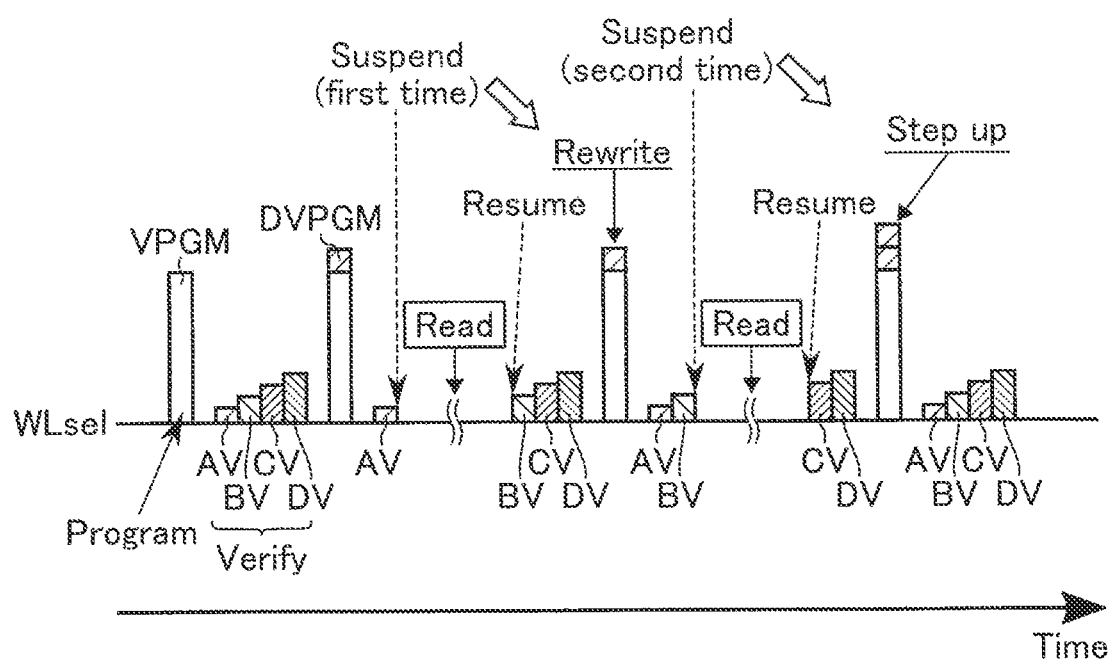
FIG. 10 is a timing chart illustrating an example of an operation that is performed when suspend read is executed in the write operation of the semiconductor memory device according to the first embodiment.

FIG. 10 shows an example of a timing chart illustrating how suspend read in a write operation is executed in the semiconductor memory device 1 according to the first embodiment, and indicates a voltage applied to word line WLsel. In this example, the verify states associated with the first program loop are the "A" state to the "D" state.

As illustrated in FIG. 10, at the start of a write operation, the sequencer 13 initially executes the first program loop process. Specifically, the sequencer 13 executes a program operation using program voltage VPGM, and subsequently executes a verify operation using verify voltages AV, BV, CV and DV. Then, the sequencer 13 executes the next program loop process. In this example, the suspend read is executed a plurality of times in the program loop.

Specifically, the sequencer 13 first executes a program operation using the stepped-up program voltage (VPGM+DVPGM). Then, the sequencer 13 executes verify read using verify voltage AV, subsequently executes a first suspend process based on the reception of a suspend command, and then executes suspend read based on an instruction from the memory controller 2. "Read" in FIG. 10 corresponds to a period in which suspend read is executed.

When the suspend read corresponding to the first suspend ends, the sequencer 13 resumes the verify operation based on the reception of a resume command. In the resumed verify operation, the sequencer 13 sequentially executes "B" state verify read to "D" state verify read, based on the fact that the "A" state verify read is executed before the first suspend. When these verify reads end, the sequencer 13 executes rewrite, based on the fact that the suspend read is executed and the rewrite is not executed in the program loop. Specifically, the sequencer 13 executes a program operation using VPGM+DVPGM.

Then, the sequencer 13 executes the verify operation associated with the rewrite, and executes the suspend read again during the verify operation. Specifically, the sequencer 13 executes "A" state verify read and "B" state verify read, subsequently executes a second suspend process based on the reception of a suspend command, and then executes suspend read based on an instruction from the memory controller 2.

When the suspend read corresponding to the second suspend ends, the sequencer 13 resumes the verify operation based on the reception of a resume command. In the resumed verify operation, the sequencer 13 sequentially executes "C" state verify read and "D" state verify read, based on the fact that the "A" state verify read and "B" state verify read are executed before the second suspend. When these verify reads end, the sequencer 13 steps up the program voltage based on the fact that the suspend read and the rewrite are executed in the program loop, and proceeds to the next program loop process. Specifically, the sequencer 13 executes a program operation using VPGM+DVPGM*2 and a verify operation.

[1-3] Advantages of First Embodiment

According to the above-mentioned semiconductor memory device 1 of the first embodiment, the generation of error bits can be suppressed and the total time of the write operation can be shortened. Detailed advantages of the semiconductor memory device 1 of the first embodiment will be described below.

In a semiconductor memory device, the threshold voltage of a memory cell may vary immediately after write. For example, in a charge trap memory cell, part of electrons injected into the charge storage layer by a write operation can be released to the channel after the write operation. The decrease in the threshold voltage that occurs after the write operation is referred to as data retention. Data retention can also occur when suspend read is performed during a program loop in a write operation. In the description below, data retention that occurs in a write operation will be referred to as short term data retention (STDR).

FIG. 11 illustrates an example of how the threshold distribution of a memory cell transistor changes when short term data retention occurs in a write operation in the "A" state. FIG. 11 (1) illustrates how the threshold distribution is when "A" state verify read is executed after a program operation. FIG. 11 (2) illustrates how the threshold distribution is when the "A" state verify read is executed again after the suspend read in succession to (1). FIG. 11 (3) illustrates how the threshold distribution is after the program operation using program voltage VPGM stepped up after (2).

At the time of FIG. 11 (1), the threshold distribution after the program operation exceeds the verify voltage AV. When "A" state verify read is executed at this point of time, the memory cell transistors MT included in this threshold distribution pass the "A" state verify. In the present example, suspend read is executed in this program loop, and short term data retention such as that illustrated in FIG. 11 (2) occurs, that is, shift of the threshold voltage Vth occurs.

If short term data retention occurs, the threshold voltages of part of the memory cell transistors MT whose threshold voltages are regarded as verify pass at the time of FIG. 11 (1) may decrease and become lower than verify voltage AV. That is, when the suspend read is executed, part of the memory cell transistors MT that should have been determined as the verify pass may be determined as the verify fail. If, in this state, a program operation using stepped-up program voltage VPGM is executed, memory cell transistors MT that are excluded from the program target without execution of the suspend read are set in the overwritten state, as illustrated in FIG. 11 (3). The occurrence of overwrite may cause an error bit.

As a countermeasure to this problem, it is conceivable to execute rewrite (that is, a program operation using the program voltage used in the program loop) in the program loop in which the suspend read is inserted. A change in the threshold voltage of the memory cell transistor MT during the rewrite is similar to that exhibited in a program loop in which the suspend read is not inserted. That is, if rewrite is performed, the occurrence of overwrite can be suppressed.

Figure 12:
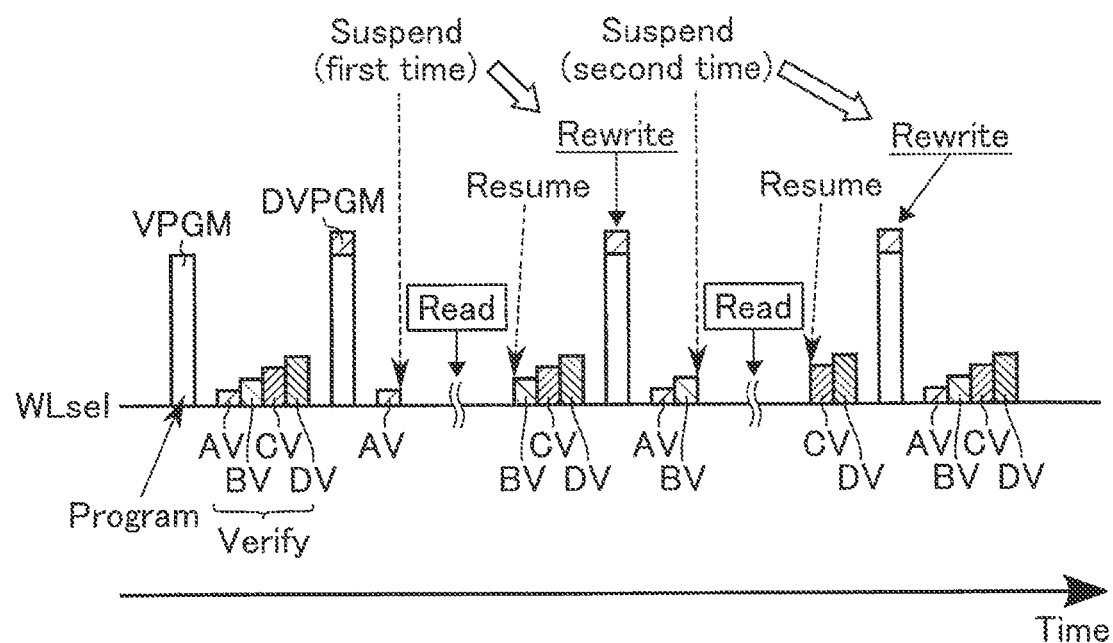
FIG. 12 is a timing chart illustrating an example of an operation that is performed when suspend read is executed in the write operation of a semiconductor memory device according to a comparative example of the first embodiment.

FIG. 12 shows an example of a timing chart illustrating how suspend read is executed in a semiconductor memory device according to a comparative example of the first embodiment. FIG. 12 illustrates an operation performed where rewrite is executed every time after suspend read. As illustrated in FIG. 12, in the comparative example, rewrite is performed after first suspend read. After this rewrite, second suspend read is executed, and rewrite is executed again after the second suspend read. If rewrite based on suspend read is executed a plurality of times in the same program loop, as in the comparative example, the program loop may not proceed.

As a countermeasure to this problem, it is conceivable to set a minimum interval at which suspend read can be executed. On the other hand, such a minimum interval leads to deterioration of the read latency of the semiconductor memory device 1, so that it is desirable that such an interval should be as short as possible or should not be set.

Therefore, in the semiconductor memory device 1 according to the first embodiment, the number of times rewrite is executed in the same program loop is limited to once. In other words, in the semiconductor memory device according to the first embodiment, the number of times a program operation (rewrite) using the same program voltage is executed when suspend read is inserted is limited to once in each program loop.

In this case, the threshold voltages of memory cell transistors MT that have transitioned from the verify pass state to the verify fail state due to short term data retention can be higher after the rewrite than before the suspend read. That is, these memory cell transistors MT are more likely to maintain the verify pass state even if the suspend read is executed again and short term data retention occurs. In other words, the number of memory cell transistors MT that transition from the verify pass state to the verify fail state due to short term data retention can be smaller after the rewrite than before the rewrite.

Thus, the semiconductor memory device 1 according to the first embodiment can suppress the generation of overwritten memory cell transistors MT even when a program operation using a program voltage stepped up after suspend read is executed. That is, the semiconductor memory device 1 according to the first embodiment can suppress the generation of error bits.

In the semiconductor memory device 1 according to the first embodiment, the number of times rewrite is executed in each program loop is limited, so that the program loop reliably proceeds even where suspend read is inserted. Furthermore, the semiconductor memory device 1 according to the first embodiment can suppress the deterioration of the read latency because an interval at which suspend read can be executed is not set. Therefore, the semiconductor memory device 1 according to the first embodiment can reduce the total time of the write operation while maintaining the read latency performance.

In connection with the first embodiment, reference was made to the case where the number of times rewrite can be executed in each program loop is limited to once, but this number of times may be set to any number. Since the number of times rewrite can be executed is set to an appropriate number, the semiconductor memory device 1 can provide a good balance between the effect of suppressing the occurrence of error bits and the effect of shortening the total time of the write operation.

[2] Second Embodiment

The semiconductor memory device 1 according to the second embodiment has a similar configuration to that of the first embodiment. The semiconductor memory device 1 according to the second embodiment executes a write operation that determines whether or not rewrite after suspend read is executed such that the determination changes in accordance with the progress of the program loop. A description will be given of the points in which the semiconductor memory device 1 according to the second embodiment differs from that according to the first embodiment.

[2-1] Write Operation when Suspend Read is Executed

Figure 13:
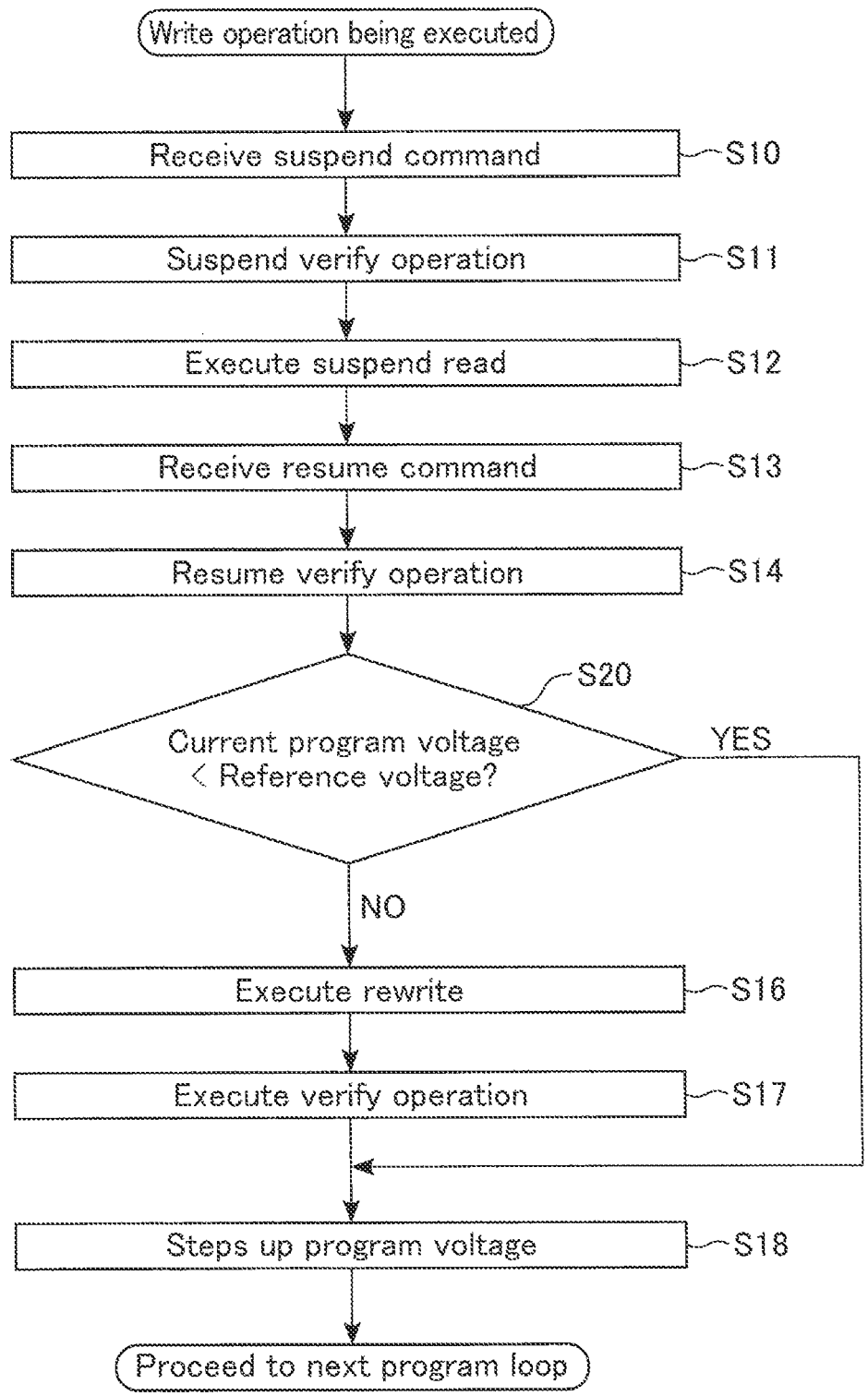
FIG. 13 is a flowchart illustrating an example of an operation that is performed when suspend read is executed in the write operation of a semiconductor memory device according to the second embodiment.

FIG. 13 shows an example of a flowchart illustrating how suspend read in a write operation is executed in the semiconductor memory device 1 according to the second embodiment. As illustrated in FIG. 13, the operation in the second embodiment is expressed by a flowchart in which the process of step S15 of the flowchart in FIG. 9 is replaced with the process of step S20.

Specifically, the semiconductor memory device 1 according to the second embodiment executes the processes of steps S10 to S14 similar to those of the first embodiment during execution of a write operation. That is, the semiconductor memory device 1 sequentially performs suspend of a verify operation, suspend read, and resume of the verify operation. When the resumed verify operation ends, the sequencer 13 executes the process of step S20.

In the process of step S20, the sequencer 13 confirms, for example, whether or not a current program voltage is lower than a reference voltage. The "current program voltage" corresponds to the program voltage used in a program loop in which suspend read is inserted. The reference voltage is set between the initial value and final value of the program voltage used in the write operation. For example, the reference voltage is set based on a program voltage of the point of time when verify read in a high threshold voltage state (such as verify read in the "E" state) is started.

If the current program voltage is lower than the reference voltage (step S20, YES), the sequencer 13 executes the process of step S18 (steps up the program voltage) and proceeds to the next program loop process. That is, where suspend read is executed when the program voltage used in the program loop in progress is low, the sequencer 13 proceeds to the next program loop without executing rewrite.

If the current program voltage is equal to or higher than the reference voltage (step S20, NO), the sequencer 13 executes the processes of steps S16 to S18 and proceeds to the next program loop process. That is, where suspend read is executed when the program voltage used in the program loop in progress is high, the sequencer 13 executes the set of rewrite and verify operation and proceeds to the next program loop.

Figure 14:
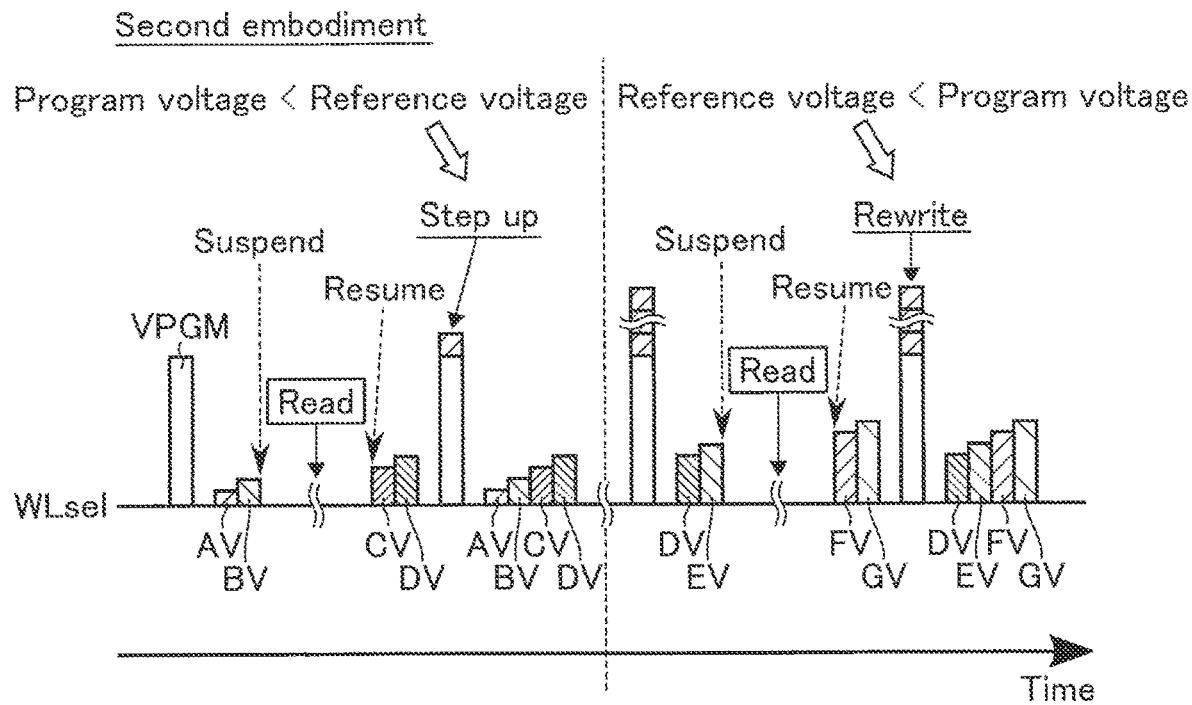
FIG. 14 is a timing chart illustrating an example of an operation that is performed when suspend read is executed in the write operation of the semiconductor memory device according to the second embodiment.

FIG. 14 shows an example of a timing chart illustrating how suspend read in a write operation is executed in the semiconductor memory device 1 according to the second embodiment, and indicates a voltage applied to word line WLsel. In this example, the verify states associated with the former half of the program loop are the "A" state to "D"

state, and the verify states associated with the latter half of the program loop are the "E" state to "G" state.

As illustrated in FIG. 14, in the write operation, the sequencer 13 first executes the process of the former half program loop, and executes suspend read during a verify operation. Specifically, the sequencer 13 executes "A" state verify read and "B" state verify read, subsequently executes a second suspend process based on the reception of a suspend command, and then executes suspend read based on an instruction from the memory controller 2. When the suspend read ends, the sequencer 13 resumes the verify operation based on the reception of a resume command.

In the resumed verify operation, the sequencer 13 sequentially executes "C" state verify read and "D" state verify read, based on the fact that the "A" state verify read and "B" state verify read are executed before the suspend. When these verify reads end, the sequencer 13 proceeds to the process of the next program loop based on the fact that the program voltage used in the program loop is lower than the reference voltage. Specifically, the sequencer 13 executes a program operation using the stepped-up program voltage VPGM and a verify operation.

Thereafter, the sequencer 13 repeatedly executes the program loop, and executes suspend read during a verify operation in the latter half of the program loop illustrated in FIG. 14. Specifically, the sequencer 13 executes "D" state verify read and "E" state verify read, subsequently executes a suspend process based on a suspend command, and then executes suspend read based on an instruction from the memory controller 2. When the suspend read ends, the sequencer 13 resumes the verify operation based on a resume command.

In the resumed verify operation, the sequencer 13 sequentially executes "F" state verify read and "G" state verify read, based on the fact that the "D" state verify read and "E" state verify read are executed before the suspend. When these verify reads end, the sequencer 13 executes rewrite, based on the fact that the program voltage used in the program loop is higher than the reference voltage. Specifically, the sequencer 13 again executes a program operation using the program voltage used in the program loop, and a verify operation. The other operations of the write operation performed in the semiconductor memory device 1 of the second embodiment are similar to those of the first embodiment, and thus a description thereof is omitted.

Figure 15:
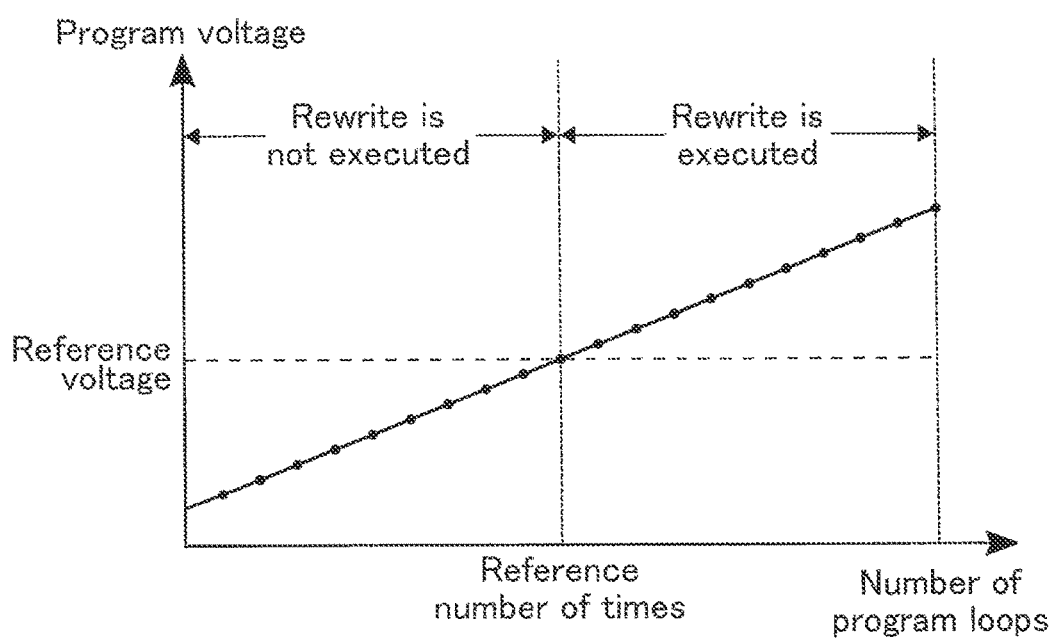
FIG. 15 is a graph illustrating an example of conditions for executing rewrite after suspend read is executed in the write operation of the semiconductor memory device according to the second embodiment.

Although FIG. 13 and FIG. 14 illustrate the case where the sequencer 13 selects whether or not to execute rewrite based on the value of the program voltage, this case is not restrictive. For example, the sequencer 13 may select whether or not to execute rewrite based on the number of times a program loop is executed and the number of times a program voltage is stepped up. FIG. 15 illustrates an example of conditions for executing rewrite after suspend read in a write operation of the semiconductor memory device according to the second embodiment. FIG. 15 illustrates the relationship between the program voltage and the number of program loops in the write operation.

As illustrated in FIG. 15, the program voltage increases as the number of program loops increases, that is, the program voltage is stepped up as the program loop progresses. This means that the value of the program voltage can be derived from the number of program loops executed. For this reason, in the second embodiment, the number of program loops, that is, the number of times the program voltage is stepped up, may be set as a reference number of times in place of the reference voltage described above. For example, whether or not the number of program loops is smaller than the reference number may be set as a determination condition used in step S20. As a result, the sequencer 13 can execute a similar operation to that described with reference to FIGS. 13 and 14.

[2-2] Advantages of Second Embodiment

Figure 16:
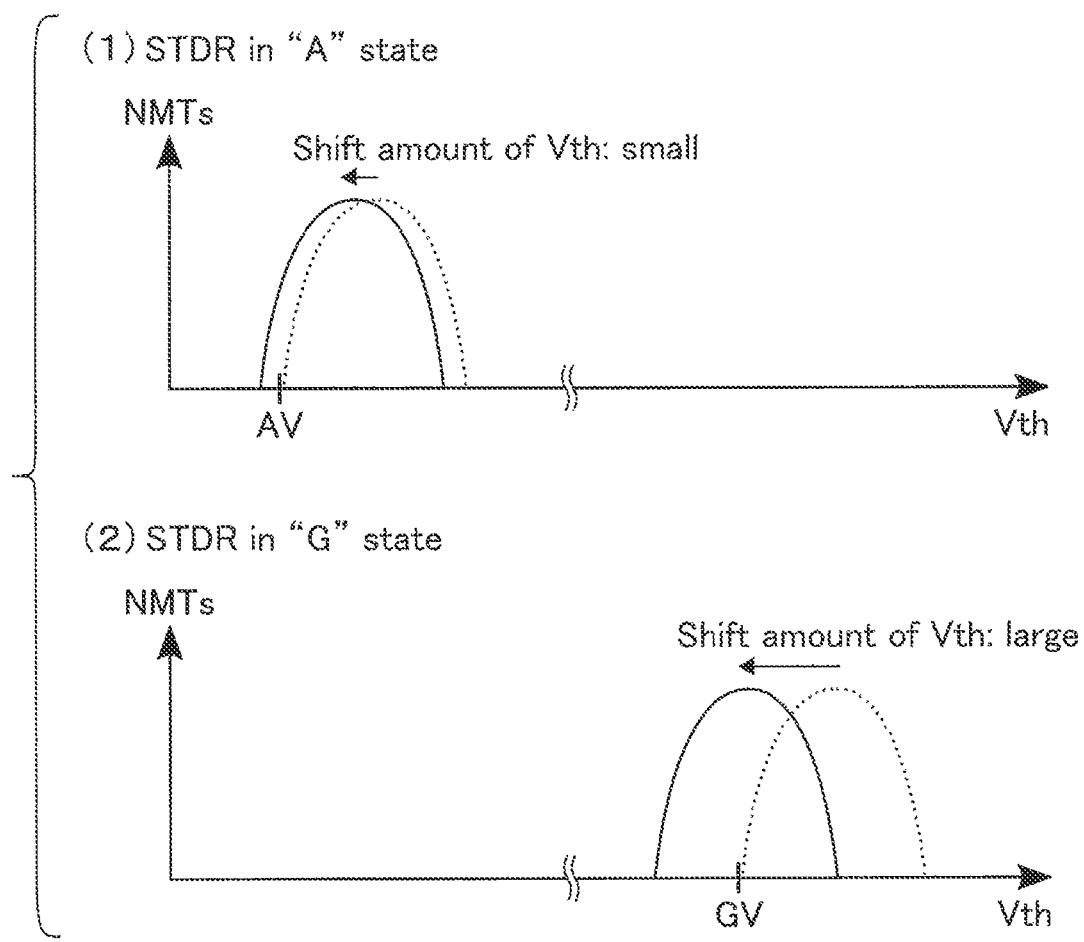
FIG. 16 is a threshold distribution diagram illustrating an example of how the threshold distribution of a memory cell transistor changes when short term data retention occurs in the write operations in the "A" state and the "G" state.

The influence of short term data retention can vary depending on the threshold voltage levels of memory cell transistors MT. FIG. 16 illustrates an example of how the threshold distribution of a memory cell transistor changes when short term data retention occurs in the write operations in the "A" state and the "G" state. As illustrated in FIG. 16, the shift amount of the threshold voltage Vth due to short term data retention in the "A" state is smaller than the shift amount of the threshold voltage Vth due to short term data retention in the "G" state. That is, the change in the threshold voltage due to the short term data retention is conspicuous in memory cell transistors MT having a high threshold voltage.

As can be seen from this, in the former half of the program loop, the threshold voltages of memory cell transistors MT of the program target are low, so that the influence of short term data retention is small. On the other hand, in the latter half of the program loop, the threshold voltages of the memory cell transistors MT of the program target become high, so that the influence of short term data retention becomes large. For this reason, the effect of executing rewrite after suspend read is greater in the latter half of the program loop than in the former half of the program loop.

Therefore, the semiconductor memory device 1 according to the second embodiment determines whether or not to execute rewrite after suspend read, based on the value of the program voltage. Specifically, where the program voltage of the program loop in which the suspend read is inserted is lower than the reference voltage, the semiconductor memory device 1 does not execute rewrite and proceeds to the next program loop. When the program voltage in the program loop in which the suspend read is inserted is equal to or higher than the reference voltage, the semiconductor memory device 1 executes rewrite and verify operation.

Thus, the semiconductor memory device 1 according to the second embodiment can accelerate the progress of the program loop in the former half thereof when the effect of rewrite is small. On the other hand, the semiconductor memory device 1 can suppress the generation of error bits by executing the rewrite in the latter half of the program loop when the effect of rewrite is large. Hence, the semiconductor memory device 1 according to the second embodiment can suppress the generation of error bits as in the first embodiment, and yet can shorten the total time of the write operation as compared with the first embodiment.

[3] Third Embodiment

The semiconductor memory device 1 according to the third embodiment has a similar configuration to that of the first embodiment. The semiconductor memory device 1 according to the third embodiment executes a write operation in which part of the verify states after rewrite are omitted, based on the state of verify read executed before suspend read. A description will be given of the points in which the semiconductor memory device 1 of the third embodiment differs from those of the first and second embodiments.

[3-1] Write Operation when Suspend Read is Executed

Figure 17:
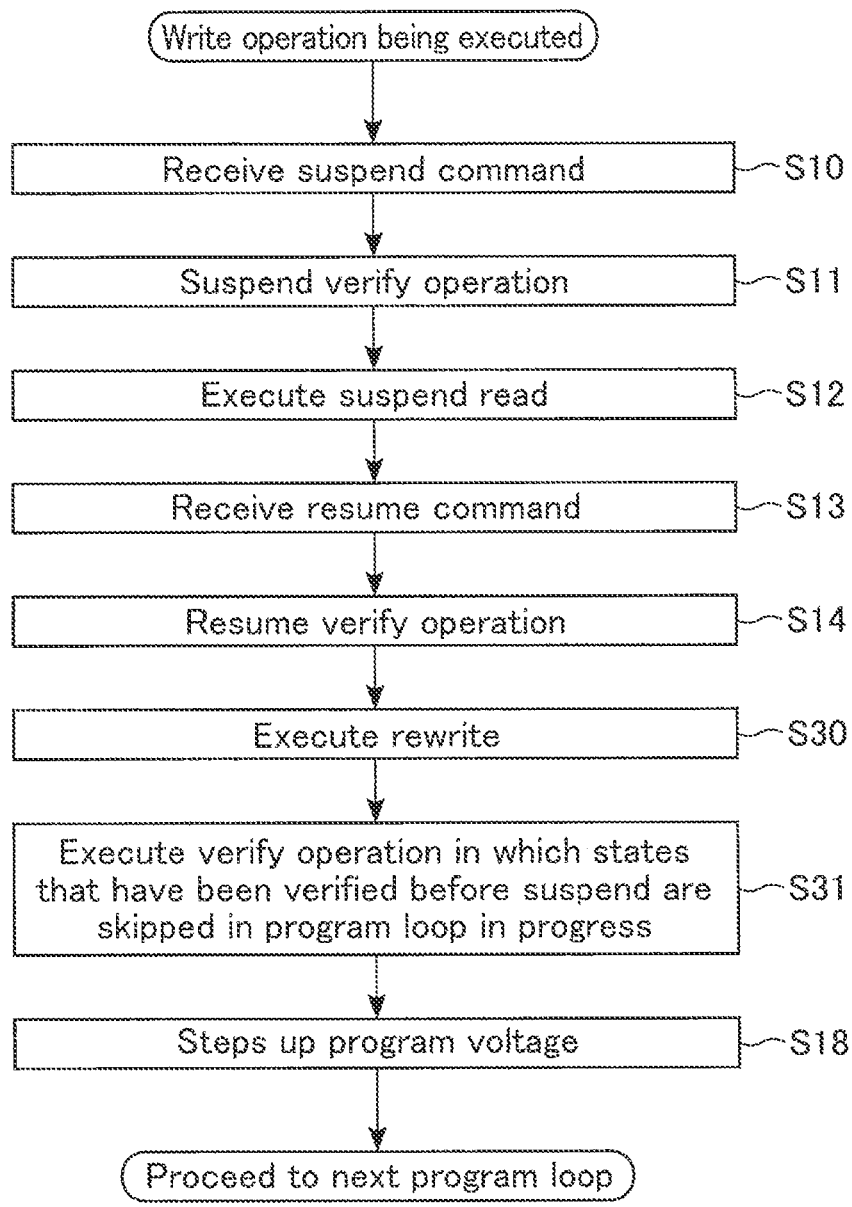
FIG. 17 is a flowchart illustrating an example of an operation that is performed when suspend read is executed in the write operation of a semiconductor memory device according to the third embodiment.

FIG. 17 shows an example of a flowchart illustrating how suspend read in a write operation is executed in the semiconductor memory device 1 according to the third embodiment. As illustrated in FIG. 17, the operation in the third embodiment is expressed by a flowchart in which the processes of steps S15 to S17 of the flowchart in FIG. 9 is replaced with the processes of steps S30 and S31.

Specifically, the semiconductor memory device 1 according to the third embodiment executes the processes of steps S10 to S14 similar to those of the first embodiment during execution of a write operation. That is, the semiconductor memory device 1 sequentially performs suspend of a verify operation, suspend read and resume of the verify operation. When the resumed verify operation ends, the sequencer 13 executes the process of step S30.

In the process of step S30, the sequencer 13 executes rewrite. Specifically, the sequencer 13 again executes a program operation using the program voltage used in the program loop. Next, in the process of step S31, the sequencer 13 executes a verify operation in which states that have been verified before suspend are skipped in the program loop in progress. Thereafter, the sequencer 13 executes the process of step S18 (steps up the program voltage), and proceeds to the next program loop process.

In the semiconductor memory device 1 according to the third embodiment, if a suspend command is received during the verify operation of step S31, the sequencer 13 returns to the process of step S11. That is, in the third embodiment, the sequencer 13 may allow a set of rewrite and verify operation to be executed a plurality of times in the write operation if suspend read is executed a plurality of times in the same program loop.

Figures 18, 19:
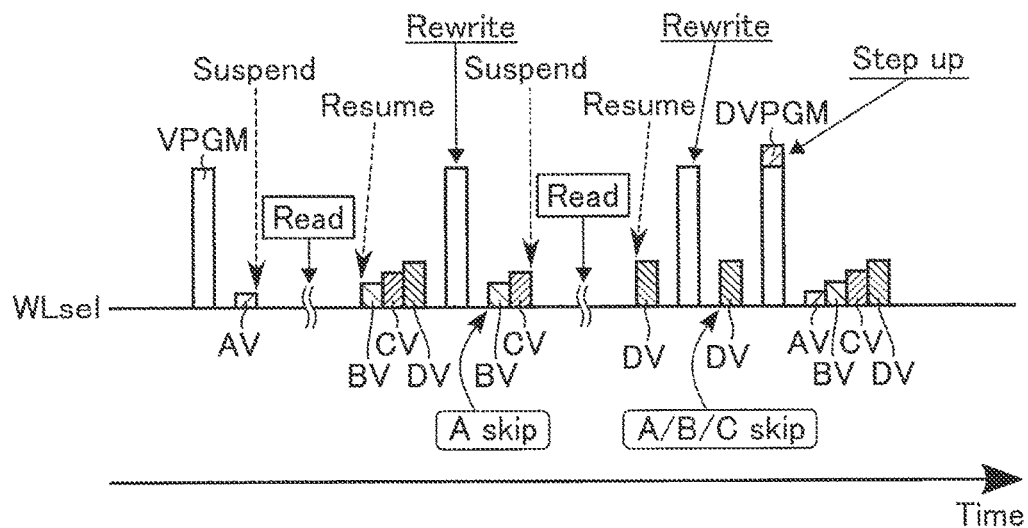
FIG. 18 is a timing chart illustrating an example of an operation that is performed when suspend read is executed in the write operation of the semiconductor memory device according to the third embodiment.
FIG. 19 is a table illustrating an example of how many times a verify operation is performed when the suspend read is executed in the write operation of a semiconductor memory device according to a comparative example of the third embodiment.

FIG. 18 shows an example of a timing chart illustrating how suspend read in a write operation is executed in the semiconductor memory device 1 according to the third embodiment, and indicates a voltage applied to word line WLsel. In this example, the verify states associated with the first program loop are "A" state to the "D" state, and suspend read is executed a plurality of times in the first program loop.

As illustrated in FIG. 18, when the write operation starts, the sequencer 13 first executes the process of the first program loop and executes suspend read during execution of a verify operation. Specifically, the sequencer 13 first executes a program operation using program voltage VPGM. Then, the sequencer 13 executes verify read using verify voltage AV, subsequently executes a first suspend process based on the reception of a suspend command, and then executes suspend read based on an instruction from the memory controller 2.

When the suspend read corresponding to the first suspend ends, the sequencer 13 resumes the verify operation based on the reception of a resume command. In the resumed verify operation, the sequencer 13 sequentially executes "B" state verify read to "D" state verify read, based on the fact that the "A" state verify read is executed before the first suspend. When these verify reads end, the sequencer 13 executes rewrite, that is, a program operation using program voltage VPGM.

Then, the sequencer 13 executes a verify operation associated with the rewrite, skipping part of the verify states. The verify states skipped by this verify operation corresponds to the state of the verify read executed before suspend read in the program loop. In this example, the sequencer 13 skips the "A" state verify read because verify read using verify voltage AV is executed before the suspend read (A skip). That is, the sequencer 13 starts the verify operation associated with the rewrite from the "B" state verify read.

Further, in the present example, the sequencer 13 executes verify read using verify voltages BV and CV, subsequently executes a second suspend process based on the reception of a suspend command, and then executes suspend read based on an instruction from the memory controller 2.

When the suspend read corresponding to the second suspend ends, the sequencer 13 resumes the verify operation based on the reception of a resume command. In the resumed verify operation, the sequencer 13 executes "D" state verify read, based on the fact that the "C" state verify read is executed before the second suspend. When this verify read ends, the sequencer 13 executes rewrite, that is, a program operation using program voltage VPGM.

Then, the sequencer 13 executes a verify operation associated with the rewrite, skipping part of the verify states. As in the verify operation after the first rewrite, the verify states skipped by the verify operation corresponds to the states of verify read executed before suspend read in the program loop. In this example, the sequencer 13 skips the "A" state, "B" state and "C" state verify reads, because verify reads using verify voltages AV, BV and CV are executed before the suspend read (A/B/C skip). That is, the sequencer 13 starts the verify operation associated with the rewrite from the "D" state verify read.

When the verify in the "D" state ends, the sequencer 13 steps up the program voltage and proceeds to the process of the next program loop. Specifically, the sequencer 13 executes a program operation using VPGM+DVPGM and a verify operation. The other operations of the write operation performed in the semiconductor memory device 1 of the third embodiment are similar to those of the first embodiment, and thus a description thereof is omitted.

[3-2] Advantages of Third Embodiment

As described above, in the semiconductor memory device 1 according to the third embodiment, the verify in the state in which verify read is executed before suspend read is skipped in the verify operation after rewrite. This is because memory cell transistor MT determined as a verify pass by the verify result before the suspend read is expected to have a predetermined increased threshold voltage without reference to the influence of short term data retention.

Further, in the memory cell transistor MT determined as a verify fail by the verify result before the suspend read, an increase amount of the threshold voltage due to the rewrite is smaller than a voltage increase amount in a program operation using a stepped-up program voltage. For this reason, even where rewrite is executed a plurality of times for the memory cell transistor MT determined to be a verify fail, the risk that the memory cell transistor MT is overwritten is small.

FIGS. 19 and 20 illustrate an example of the number of times verify is executed when suspend read is executed in a write operation of a semiconductor memory device. FIG. 19 corresponds to a comparative example of the third embodiment, and FIG. 20 corresponds to the third embodiment. FIGS. 19 and 20 illustrate the correspondence between the timing at which suspend read is executed (suspend timing) and the state in which verify read is executed (verify execution state).

As illustrated in FIG. 19, in the semiconductor memory device 1 according to the comparative example of the third embodiment, four-state verify reads after resume are executed immediately after application of a program voltage, three-state verify reads after resume are executed after execution of one-state verify, two-state verify reads after resume are executed after execution of two-state verifies, and one-state verify read after resume is executed after execution of three-state verifies. In the comparative example, four-state verify reads after rewrite are executed in each case. In the comparative example, therefore, verify read is executed eight times immediately after application of the program voltage, seven times after execution of one-state verify, six times after execution of two-state verifies, and five times after execution of three-state verifies.

As illustrated in FIG. 20, in the semiconductor memory device 1 according to the third embodiment, the number of times verify read is executed after resume is the same as that of the comparative example. On the other hand, the third embodiment differs from the comparative example in that the number of times verify read after rewrite is executed is the same as the number of times verify read after resume is executed. In the third embodiment, verify read is executed eight times immediately after application of the program voltage, six times after execution of one-state verify, four times after execution of two-state verifies, and twice after execution of three-state verifies. Thus, verify read is executed a fewer number of times under some conditions.

As described above, the semiconductor memory device 1 according to the third embodiment can gradually proceed with the program loop even where the suspend read and rewrite are executed a plurality of times in the same program loop. As a result, the semiconductor memory device 1 according to the third embodiment can suppress the generation of error bits as in the first embodiment, and yet can shorten the total time of the write operation.

[4] Modifications

The above-mentioned embodiments may be combined. For example, the first embodiment and the third embodiment may be combined such that the number of rewrites performed in the third embodiment may be limited to once as in the first embodiment. Thereby, the semiconductor memory device 1 according to the third embodiment can shorten the total time of the write operation as compared with the first embodiment. Further, the second embodiment and the third embodiment may be combined, and the first to third embodiments may be combined.

In connection with the above embodiments, reference was made to the case where a write operation is suspended in the middle of a verify operation, but the timing at which the write operation is suspended may be between the verify operation and the program operation. For example, where suspend read is executed immediately after the program operation is executed in a program loop, the sequencer 13 executes a verify operation associated with the program voltage and appropriately performs a rewrite based on the conditions set in each embodiment. Further, where suspend read is executed immediately after both the program operation and the verify operation are executed in a certain program loop, the operation of the program loop ends, and thus the process proceeds to the next program loop.

The timing charts used for illustrating how a read operation is performed in the above embodiments are merely examples. For example, the timings at which the voltages of signals and interconnects are controlled may be shifted. In the above embodiments, the voltages applied to various interconnects in the memory cell array 10 may be estimated based on the voltages of the signal lines between the driver module 14 and the row decoder module 15. For example, the voltage applied to word line WLsel can be estimated based on the voltage of signal line CG.

In this specification, the "H" level voltage is a voltage that turns on an N-type MOS transistor when the voltage is applied to its gate, and that turns off a P-type MOS transistor when the voltage is applied to its gate. The "L" level voltage is a voltage that turns on an N-type MOS transistor when the voltage is applied to its gate, and that turns off a P-type MOS transistor when the voltage is applied to its gate. "One end of a transistor" indicates either the drain or source of an MOS transistor. "The other end of a transistor" indicates either the source or drain of the MOS transistor.

In the present specification, the term "coupling" is intended to mean that elements are electrically coupled and does not exclude the case where another element is interposed therebetween. "OFF state" is intended to indicate that a voltage lower than the threshold voltage of a transistor is applied to the gate of the transistor, and does not exclude the case where a minute current such as a leakage current of the transistor flows.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a plurality of memory cells each configured to store a plurality of bits of data;
a word line electrically connected to the plurality of memory cells; and
a controller configured to execute a write operation, wherein
in the write operation, the controller is configured to repeatedly execute a program loop including a program operation and a verify operation,
the program loop includes a first program loop and a second program loop,
the first program loop includes a first program operation and a first verify operation after the first program operation, in the first program operation, the controller applying a first program voltage to the word line,
the second program loop includes a second program operation, in the second program operation, the controller applying a second program voltage higher than the first program voltage to the word line,
in the first program loop, the controller is configured to:
stop the first verify operation upon reception of a first suspend command; and
resume the first verify operation upon reception of a first resume command, and
the controller is configured to execute the second program loop upon execution of the first program loop a first number of times after reception of the first resume command.

2. The device of claim 1, wherein
if the first suspend command is received when the first verify operation is executed, a voltage that the controller applies to the word line when receiving the first suspend command is a first verify voltage, and a verify voltage that the controller first applies to the word line after receiving the first resume command is a second verify voltage higher than the first verify voltage.

3. The device of claim 2, wherein
in the first verify operation of the first program loop executed after reception of the first resume command, a verify voltage that the controller first applies to the word line is the second verify voltage.

4. The device of claim 3, wherein
the controller omits a verify using the first verify voltage in the first program loop executed after reception of the first resume command.

5. The device of claim 1, wherein
the controller executes a read operation upon reception of a read command while the first verify operation is being stopped.

6. The device of claim 1, wherein
the first number of times is once.

7. A semiconductor memory device, comprising:
a plurality of memory cells each configured to store a plurality of bits of data;
a word line electrically connected to the plurality of memory cells; and
a controller configured to execute a write operation, wherein
in the write operation, the controller is configured to repeatedly execute a program loop including a program operation and a verify operation,
the program loop includes a first program loop and a second program loop,
the first program loop includes a first program operation and a first verify operation after the first program operation, in the first program operation, the controller applying a first program voltage to the word line,
the second program loop includes a second program operation, in the second program operation, the controller applying a second program voltage higher than the first program voltage to the word line,
in the first program loop, the controller is configured to:
stop the first verify operation upon reception of a first suspend command; and
resume the first verify operation upon reception of a first resume command, and
the controller is configured to execute the second program loop without repeatedly executing the first program loop after reception of the first resume command and if the first program voltage is a reference voltage or lower.

8. The device of claim 7, wherein
the second program loop includes a second verify operation after the second program operation,
in the second program loop, the controller
stops the second verify operation upon reception of a second suspend command, and
resumes the second verify operation upon reception of a second resume command,
the controller executes the second program loop a first number of times after reception of the second resume command and if the second program voltage is higher than the reference voltage.

9. The device of claim 8, wherein
the first number of times is once.

10. The device of claim 8, wherein
if the second suspend command is received when the second verify operation is executed,
a voltage that the controller applies to the word line when receiving the second suspend command is a first verify voltage, and
a verify voltage that the controller first applies to the word line after receiving the second resume command is a second verify voltage higher than the first verify voltage.

11. The device of claim 10, wherein
in the second verify operation of the second program loop executed after reception of the second resume command,
a verify voltage that the controller first applies to the word line is the second verify voltage.

12. The device of claim 11, wherein
the controller omits a verify using the first verify voltage in the first program loop executed after reception of the first resume command.

13. The device of claim 7, wherein
the controller executes a read operation upon reception of a read command while the first verify operation is being stopped.

14. A semiconductor memory device, comprising:
a plurality of memory cells each configured to store a plurality of bits of data;
a word line electrically connected to the plurality of memory cells; and
a controller configured to execute a write operation, wherein
in the write operation, the controller is configured to repeatedly execute a program loop including a program operation and a verify operation,
the program loop includes a first program loop,
the first program loop includes a first program operation and a first verify operation after the first program operation, in the first program operation, the controller applying a first program voltage to the word line, in the first verify operation, the controller applying a first verify voltage to the word line,
in the first program loop, the controller is configured to:
stop the first verify operation upon reception of a first suspend command; and
resume the first verify operation upon reception of a first resume command, and
in the first verify operation of the first program loop executed after reception of the first resume command, a verify voltage that the controller first applies to the word line is a second verify voltage higher than the first verify voltage.

15. The device of claim 14, wherein
the controller omits a verify using the first verify voltage in the first program loop executed after reception of the first resume command.

16. The device of claim 14, wherein
the program loop includes a second program loop,
the second program loop includes a second program operation, in the second program operation, the controller applying a second program voltage higher than the first program voltage to the word line, and
the controller executes the second program loop upon execution of the first program loop a first number of times after reception of the first resume command.

17. The device of claim 16, wherein
the first number of times is once.

18. The device of claim 14, wherein the program loop includes a second program loop, the second program loop includes a second program operation, in the second program operation, the controller applying a second program voltage higher than the first program voltage to the word line, and the controller executes the second program loop without repeatedly executing the first program loop after reception of the first resume command and if the first program voltage is a reference voltage or lower.

19. The device of claim 14, wherein the program loop includes a second program loop, the second program loop includes a second program operation, in the second program operation, the controller applying a second program voltage higher than the first program voltage to the word line, and the controller executes the second program loop without repeatedly executing the first program loop after reception of the first resume command and if a number of times the program voltage is stepped up is smaller than a reference number of times.

20. The device of claim 14, wherein the controller executes a read operation upon reception of a read command while the first verify operation is being stopped.

* * * * *